(12) United States Patent
Chang et al.

(10) Patent No.: US 9,449,138 B2
(45) Date of Patent: *Sep. 20, 2016

(54) PROTOTYPE AND EMULATION SYSTEM FOR MULTIPLE CUSTOM PROTOTYPE BOARDS

(71) Applicant: Synopsys Taiwan Co., Ltd., Taipei (TW)

(72) Inventors: Yingtsai Chang, Fremont, CA (US); Sweyyan Shei, Cupertino, CA (US); Hung-Chun Chiu, Fremont, CA (US); Meng-Chyi Lin, Toufen Township (TW); Hwa Mao, Da-an District (TW); Ming-Yang Wang, Lafayette, CA (US); Yu-Chin Hsu, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/452,368

(22) Filed: Aug. 5, 2014

(65) Prior Publication Data

US 2014/0351777 A1    Nov. 27, 2014

Related U.S. Application Data

(63) Continuation of application No. 13/856,004, filed on Apr. 3, 2013, now Pat. No. 8,839,179, which is a continuation-in-part of application No. 13/730,543, filed on Dec. 28, 2012, now Pat. No. 8,719,762, which (Continued)

(51) Int. Cl.
*G06F 17/50* (2006.01)

(52) U.S. Cl.
CPC ....... *G06F 17/5081* (2013.01); *G06F 17/5027* (2013.01)

(58) Field of Classification Search
CPC .................. G06F 17/5081; G06F 17/5027
USPC .................. 716/106, 108, 111, 116, 136
See application file for complete search history.

(56) References Cited

U.S. PATENT DOCUMENTS

| 5,425,036 A | 6/1995 | Liu et al. |
| 5,457,408 A | 10/1995 | Leung |

(Continued)

FOREIGN PATENT DOCUMENTS

| JP | 2007292492 | 8/2007 |
| JP | 2009031933 | 12/2009 |

OTHER PUBLICATIONS

*Ex Parte Quayle* Action for U.S. Appl. No. 13/856,004 mailed Feb. 14, 2014, 7 pages.

(Continued)

*Primary Examiner* — Sun Lin
(74) *Attorney, Agent, or Firm* — Alston & Bird LLP

(57) ABSTRACT

A system for emulating a circuit design is presented. The system includes a host workstation coupled by an emulation interface to a field programmable gate array (FPGA) configured to emulate and verify the circuit design when the host workstation is invoked to verify the circuit design. The emulation interface is configured to provide timing and control information for at least the verify. The system further includes a non-transitory computer readable storage medium including instructions, which when executed cause a computer to compile a portion of the circuit design and an associated verification module adapted to configure the FPGA. A compilation is performed in accordance with a description file.

40 Claims, 20 Drawing Sheets

Related U.S. Application Data is a continuation-in-part of application No. 13/597,997, filed on Aug. 29, 2012, now Pat. No. 8,732,650, which is a continuation-in-part of application No. 13/025,809, filed on Feb. 11, 2011, now Pat. No. 8,281,280.

(60) Provisional application No. 61/582,194, filed on Dec. 30, 2011, provisional application No. 61/561,045, filed on Nov. 17, 2011, provisional application No. 61/304,328, filed on Feb. 12, 2010.

(56) References Cited

U.S. PATENT DOCUMENTS

| | | | |
|---|---|---|---|
| 5,896,494 | A | 4/1999 | Perugini et al. |
| 5,960,191 | A | 9/1999 | Sample et al. |
| 5,991,897 | A | 11/1999 | Perugini et al. |
| 6,002,868 | A | 12/1999 | Jenkins et al. |
| 6,754,881 | B2 | 6/2004 | Kuhlmann et al. |
| 6,842,729 | B2 | 1/2005 | Sample et al. |
| 6,961,691 | B1 | 11/2005 | Selvidge et al. |
| 7,072,825 | B2 | 7/2006 | Wang et al. |
| 7,353,162 | B2 | 4/2008 | Huang et al. |
| 7,424,416 | B1 | 9/2008 | Cavanagh et al. |
| 8,281,280 | B2 | 10/2012 | Chang et al. |
| 8,719,762 | B2 | 5/2014 | Chang et al. |
| 8,732,650 | B2 | 5/2014 | Chang et al. |
| 2011/0251836 | A1 | 10/2011 | Wang et al. |
| 2013/0227509 | A1 | 8/2013 | Chang et al. |

OTHER PUBLICATIONS

Notice of Allowance for U.S. Appl. No. 13/856,004 mailed May 5, 2014, 5 pages.

Non-Final Office Action for U.S. Appl. No. 13/730,543 mailed May 23, 2013, 7 pages.

Notice of Allowance for U.S. Appl. No. 13/730,543 mailed Dec. 24, 2013, 9 pages.

Non-Final Office Action for U.S. Appl. No. 13/597,997 mailed Jun. 12, 2013, 5 pages.

Notice of Allowance for U.S. Appl. No. 13/597,997 mailed Jan. 13, 2014, 8 pages.

Non-Final Office Action for U.S. Appl. No. 13/025,809 mailed Apr. 13, 2012, 6 pages.

Notice of Allowance for U.S. Appl. No. 13/025,809 mailed May 31, 2012, 8 pages.

Non-Final Office Action for U.S. Appl. No. 14/089,522 mailed May 9, 2014, 8 pages.

MAO, "Prototyping the Next-Generation SoC Verification Platform," Components in Electronics, Mar. 2011, pp. 40-41.

Office Action as received in corresponding Japanese Application No. 2012-026121, dated Jan. 12, 2016.

```
module custom_board (connector1_pins, connector2_pins);
wire [119:0] connector1_pins, connector2_pins;
inout [119:0] connector1_pins, connector2_pins;
wire local_sig1, local_sig2, ...

xc5vlx330 F1(.A1 (connector1_pins[0]),
.A2(connector1_pins[1]),
.A3(local_sig1),
.A4(connector1_pins[2]),
....);

xc5vlx330 F2(.A1 (connector2_pins[0]),
.A2(connector2_pins[1]),
.A3(local_sig1),
.A4(connector1_pins[2]),
....);

endmodule
```

FIG. 7

```
[custom_board.F1]
Device= xc5vlx330-ff1760
...
```

FIG. 8

PROTOTYPE AND EMULATION SYSTEM FOR MULTIPLE CUSTOM PROTOTYPE BOARDS

REFERENCES TO RELATED APPLICATIONS

This application is a continuation of U.S. application Ser. No. 13/856,004, entitled "Prototype and Emulation System for Multiple Custom Prototype Boards," filed on Apr. 3, 2013, which is a continuation-in-part of U.S. application Ser. No. 13/730,543, now U.S. Pat. No. 8,719,762, entitled "Method and Apparatus for Turning Custom Prototype Boards into Co-Simulation, Co-Emulation Systems," filed on Dec. 28, 2012, which claims benefit under 35 USC 119 (e) of U.S. Provisional Application No. 61/582,194, filed on Dec. 30, 2011, and entitled "Method and Apparatus for Turning Custom Prototype Boards into Co-Simulation, Co-Emulation Systems," the contents of all of which are incorporated herein by reference in their entirety. U.S. application Ser. No. 13/730,543 is a continuation-in-part of U.S. application Ser. No. 13/597,997, now U.S. Pat. No. 8,732,650, entitled "Method and Apparatus for Versatile Controllability and Observability in Prototype System," filed on Aug. 29, 2012, which claims benefit under 35 USC 119(e) of U.S. Provisional Application No. 61/561,045 filed on Nov. 17, 2011, the contents of all of which are incorporated herein by reference in their entirety. U.S. application Ser. No. 13/597, 997 is a continuation-in-part of application Ser. No. 13/025, 809, now U.S. Pat. No. 8,281,280, entitled "Method and Apparatus for Versatile Controllability and Observability in Prototype System," filed on Feb. 11, 2011, which claims benefit under 35 USC 119 (e) of U.S. Provisional Application No. 61/304,328 filed on Feb. 12, 2010, the contents of all of which are incorporated herein by reference in their entirety.

FIELD OF THE INVENTION

The present disclosure generally relates to design verification methods and systems for semiconductor or integrated circuit devices and, more specifically, to design verification systems and methods utilizing a prototype system.

BACKGROUND

Various semiconductor, circuit, and integrated circuit ("IC") devices, such as system-on-chip ("SoC") devices, are emulated or verified during their design and development processes. As an example, highly-integrated SoC devices may power or support a wide variety of products to facilitate various hardware, software, and/or device applications. To meet these demands, SoC devices continue to increase in size and complexity, and their capabilities and manufacturability are in-part aided by advance semiconductor processing technologies and availability of verified and well-developed libraries, e.g. design or circuit intellectual property ("IP") libraries. The development of SoCs or other circuits or devices in some cases nevertheless may increase the burden on design verification processes, methods, or systems. In some cases, verification may consume a significant amount of time or resources during an SoC development cycle.

Circuit design verification approaches can vary. Given the expectation for speed, the various approaches of software development, hardware development, or system validation may provide varying levels of observability and control. Field programmable gate array ("FPGA") prototype systems, for example, can provide improved system execution time due to its hardware-based implementation. Some FPGA verification systems, nevertheless, lack the ability to isolate some of the root causes of discoverable errors for various reasons. For example, the lack of visibility regarding the multitude of signals within the design. Depending on the environment, software, and hardware constraints, in some cases, deficiencies in certain FPGA vendor-specific verification tools may include access to a limited number of signals, and limited sample capture depth. Even combined with an external logic analyzer, FPGA vendor-specific verification tools, in some instances, may lack sufficient capabilities to isolate root cause errors during design verification.

Verification systems may also support co-simulation and co-emulation using the FPGA devices. However, the FPGA device and devices are generally part of a closed vendor proprietary system, and such vendor-specific verification tools typically only work with their own FPGA device types and typically cannot be customized to other FPGA type devices. Therefore, users can not use or design their own FPGA-based prototyping systems.

System-on-chip (SoC) design verification requires both software and hardware to work together on a prototype board. A custom-built prototype board having integrated software and hardware provides a simple way to verify a design but due to its lack of controllability and observability, it has a limited capability in isolating root causes of design defects.

SUMMARY

One implementation is a test system, which includes a host workstation configured to divide a user design into a plurality of design partitions and to generate a plurality of first verification modules, where each first verification module is associated with one of the design partitions. The test system also includes a first interface device coupled to the host workstation and configured to receive the design partitions and the associated verification modules from the host workstation, and second and third interface devices each coupled to the first interface device, where the second and third interface devices are collectively configured to receive the design partitions and the associated verification modules from the first interface device. The second interface device is configured to receive at least one of the design partitions and at least one associated verification module from the first interface device, and the third interface device is configured to receive at least one of the design partitions and at least one associated verification module from the first interface device. The second interface device is configured to connect to a first programmable prototype board, and to program the first prototype board with the at least one design partition and associated verification module received by the second interface device, and the third interface device is configured to connect to a second programmable prototype board, and to program the second prototype board with the at least one design partition and associated verification module received by the third interface device.

Another implementation is a test system, which includes a host workstation configured to divide a user design into a plurality of first design partitions and to generate a plurality of first verification modules, where each first verification module is associated with one of the first design partitions. The host workstation is further configured to divide the user design into a plurality of second design partitions and to generate a plurality of second verification modules, where each second verification module is associated with one of the second design partitions. The test system also includes a first interface device coupled to the host workstation and configured to receive the first design partitions and the associated first verification modules from the host workstation, where the first interface device is configured to connect to a first programmable prototype board, and to program the first prototype board with the first design partitions and the associated first verification modules. The test system also includes a second interface device coupled to the host workstation and configured to receive the second design partitions and the associated second verification modules from the host workstation, where the second interface device is configured to connect to a second programmable prototype board, and to program the second prototype board with the second design partitions and the associated second verification modules.

Another implementation is a test system, which includes a host workstation configured to divide a first user design into a plurality of first design partitions and to generate a plurality of first verification modules, where each first verification module is associated with one of the first design partitions. The host workstation is further configured to divide a second user design into a plurality of second design partitions and to generate a plurality of second verification modules, where each second verification module is associated with one of the second design partitions. The test system also includes a first interface device coupled to the host workstation and configured to receive the first design partitions and the associated first verification modules from the host workstation, where the first interface device is configured to connect to a first programmable prototype board, and to program the first prototype board with the first design partitions and the associated first verification modules. The test system also includes a second interface device coupled to the host workstation and configured to receive the second design partitions and the associated second verification modules from the host workstation, where the second interface device is configured to connect to a second programmable prototype board, and to program the second the prototype board with the second design partitions and the associated second verification modules.

A better understanding of the nature and advantages of the embodiments of the present invention may be gained with reference to the following detailed description and the accompanying drawings.

BRIEF DESCRIPTION OF THE DRAWINGS

FIGS. 7 and 8 illustrate exemplary device description files consistent with disclosed embodiments.

DETAILED DESCRIPTION

Reference is made to implementations illustrated in the accompanying drawings. The same reference numbers are generally used throughout the drawings and the following description to refer to the same, or in some cases, like parts. It should be noted that the drawings are in greatly simplified form and are not to precise scale.

In the following description, the terms "coupled" and "connected," along with their derivatives, can be used. It should be understood that these terms are not intended as interchangeable synonyms for each other. Rather, in particular embodiments, "connected" and/or "coupled" can be used to indicate that two or more elements are in direct physical or electronic contact with each other. However, "coupled"

can also mean that two or more elements are not in direct contact with each other, but yet still cooperate, communicate, and/or interact with each other.

Figure 1:
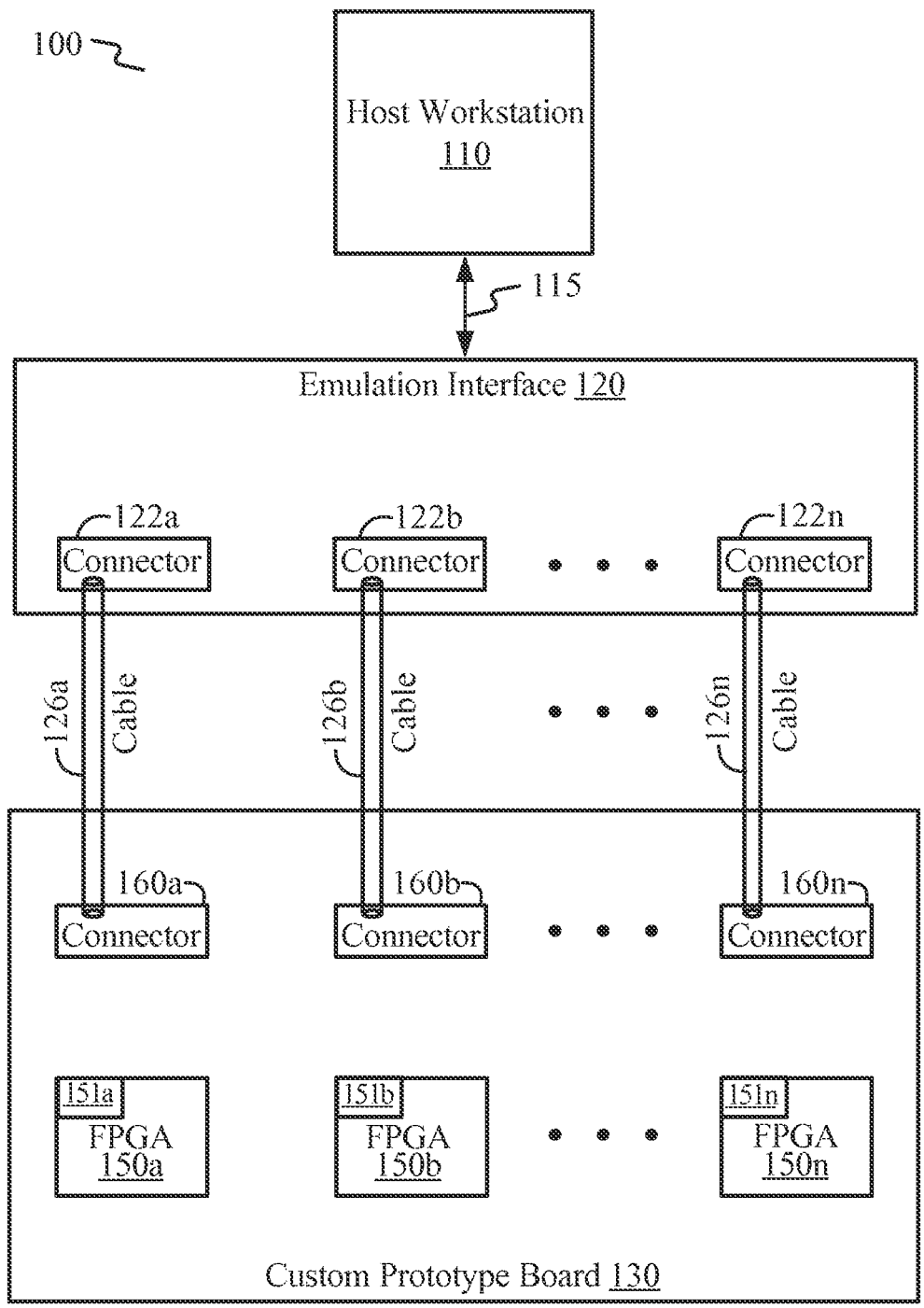
FIG. 1 is a block diagram illustrating an exemplary prototype system consistent with disclosed embodiments comprising n FPGA chips.

FIG. 1 illustrates an exemplary prototype system 100 consistent with disclosed embodiments. By way of example, and as illustrated in FIG. 1, prototype system 100 can include a combination of hardware components, emulation interface, and a reconfigurable verification module adapted to improve visibility and control of a device under test during a design verification process.

Prototype system 100 can include host workstation 110 connected through bus 115 to emulation interface 120, which is connected through connectors 122a, 122b, ... 122n to custom prototype board (or interchangeably, custom prototype board) 130. In some embodiments, custom prototype board 130 can be any emulation hardware of customers/engineers/companies who use the device to emulate circuit designs. For example, one or more custom prototype boards may include one or more Field Programmable Gate Arrays ("FPGAs"), such as FPGAs 150a-150n, which may emulate a design, circuit, or device under test (DUT), and connectors 160a-160n. Additionally, verification modules 151a-151n can be configured or be capable of being configured and combined with partitioned portions of the design designated to each FPGA chip of 150a-150n. As shown in FIG. 1, custom prototype board 130 can include one or more FPGA chips (for example, FPGA chips 150a, 150b through 150n), one or more connectors (for example, connectors 160a, 160b, through 160n) and corresponding number of cables (for example, cables 126a, 126b, through 126n).

Figure 2:
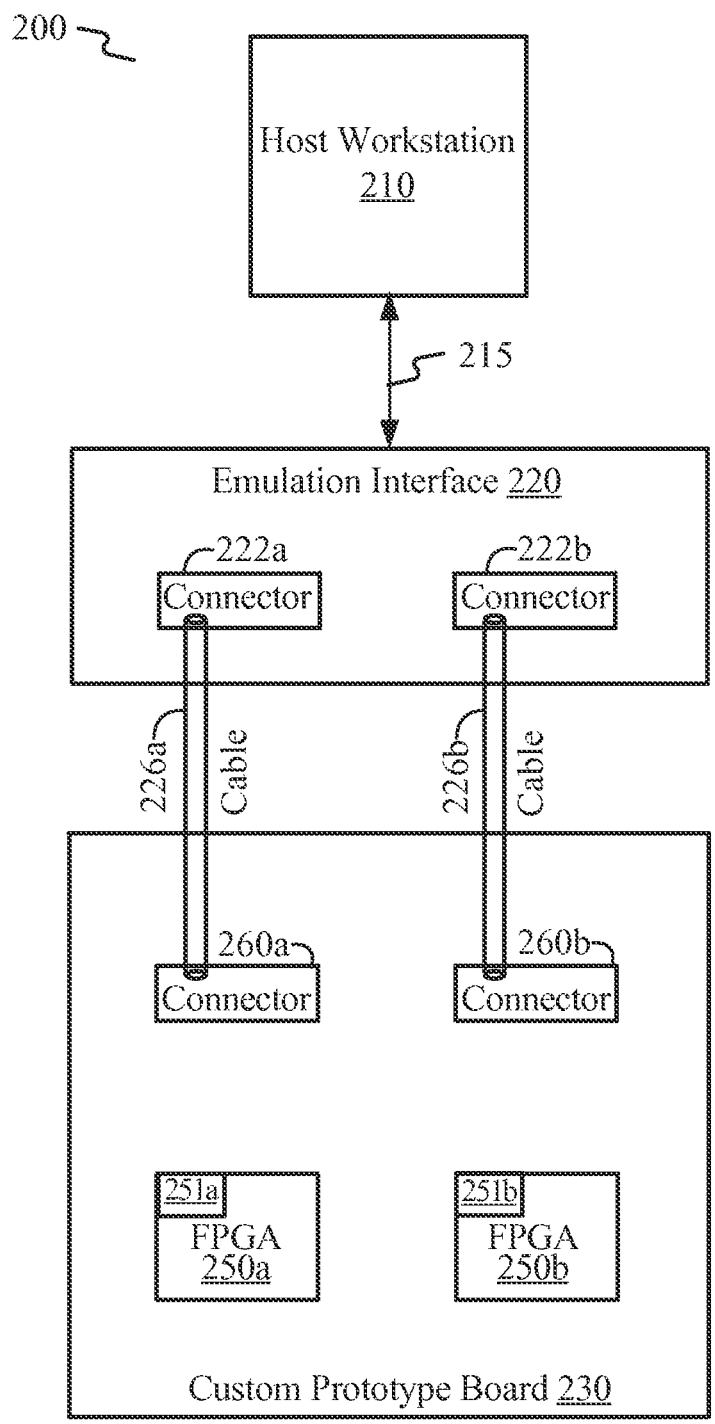
FIG. 2 is a block diagram illustrating an exemplary prototype system diagram consistent with disclosed embodiments comprising two FPGA chips.

In some embodiments, the number of FPGA chips 150 can vary from a number as low as one to a large number n. An exemplary system 200 comprising two FPGA chips, 250a and 250b, is illustrated by FIG. 2. Exemplary system of FIG. 2 also comprises two connectors, 260a and 260b, within custom prototype board 230, two connectors, 222a and 222b, within emulation interface 220, and two cables, 226a and 226b, coupling between custom prototype board 230 and emulation interface 220. This exemplary prototype system includes custom prototype board 230 with two FPGA chips, 250a and 250b. The disclosure, however, is not limited to custom prototype board 230 with two FPGA chips, 250a and 250b, but rather extends to custom prototype boards with any number of FPGA chips, as can be determined by a user.

Host workstation 210 can be coupled with emulation interface device 220 over host communication channel 215 using an interface communication protocol, such as one of the computer interface standards. For example, in some embodiments, host communication channel 215 can be a wired communication method, such as Peripheral Component Interconnect (PCI) Express, IEEE 1394, Ethernet, or other interface methods allowing exchange of commands and data between host workstation 210 and emulation interface 220. Emulation interface 220 and custom prototype board 230 are coupled with cables 226a and 226b between connectors 260a and 260b on custom prototype board 230 and connectors 222a and 222b on emulation interface 220. Emulation interface 220 may be, for example, a board, a card, or another device.

Figure 3:
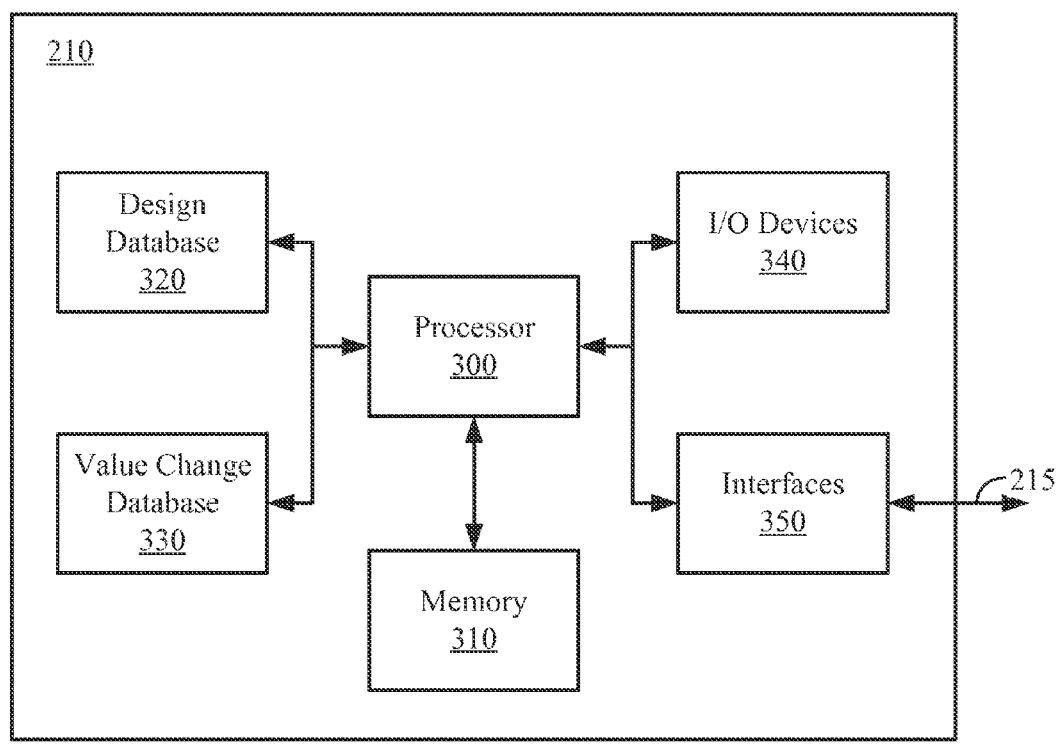
FIG. 3 is a diagram illustrating a block diagram of an exemplary host workstation consistent with disclosed embodiments.

FIG. 3 illustrates a block diagram of an exemplary host workstation 210 consistent with disclosed embodiments. By way of example, and as illustrated in FIG. 3, host workstation 210 can include one or more of the following components: at least one processor 300, which can be configured or be capable of being configured to execute computer program instructions to perform various prototype system instructions and methods, memory 310, which can be configured or be capable of being configured to store and provide information and computer program instructions, design database 320, which can be configured or be capable of being configured to maintain runtime software and design information, value-change database 330 to store information received from custom prototype board 230, Input/Output ("I/O") devices 340, and interfaces 350.

As used herein, the term "processor" can include an electric circuit that executes one or more instructions. For example, such a processor can include one or more integrated circuits, microchips, microcontrollers, microprocessors, embedded processor, all or part of a central processing unit (CPU), digital signal processors (DSP), FPGA or other circuit suitable for executing instructions or performing logic operations. Processor 300 can be a special purpose processor in that it can be configured or be capable of being configured and programmed to operate as a verification processor programmed to exchange commands and data with custom prototype board 230. For example, processor 300 can act upon instructions and data output from memory 310, design database 320, value change database 330, I/O devices 340, interfaces 350, or other components (not shown). In some embodiments, processor 300 can be coupled to exchange data or commands with memory 310, design database 320, and value change database 330. For example, processor 300 can execute instructions that sends FPGA image data containing verification module 251a and 251b and a portion of DUT to FPGA chips 250a and 250b during prototype system downloads.

In accordance with some embodiments, more than one processor can be configured to operate independently or collaboratively. All processors can be of similar construction, or they can be of differing constructions electrically connected or disconnected from each other. As used herein, "construction" can include physical, electrical, or functional characteristics of the processor. Processors can be physically or functionally separate circuits or integrated in a single circuit. They can be coupled electrically, magnetically, optically, acoustically, mechanically, wirelessly or in any other way permitting communicated between them.

In accordance with some embodiments, memory 310 can be a computer readable memory, such as a random access memory (RAM), a read-only memory (ROM), a programmable read-only memory (PROM), a field programmable read-only memory (FPROM), a hard disk, an optical disk, a magnetic medium, a flash memory, other permanent, fixed, volatile memory, non-volatile memory, or any other tangible mechanism capable of providing instructions to processor 300 or similar component. For example, memory 310 can store instructions and data to perform verification functions on custom prototype board 230 in accordance with information stored in design database 320. Memory 310 can be distributed. That is, portions of memory 310 can be removable or non-removable, or located in geographically distinct locations.

In accordance with some embodiments, design database 320 can be a structured collection of tables, lists, or other data for design verification setup and runtime execution. As such, the structure can be organized as a relational database or an object-oriented database. In other embodiments, design database 320 can be a hardware system comprising physical computer readable storage media and input and/or output devices configured or be capable of being configured to receive and provide access to tables, lists, or other data structures. Further, configured as a hardware system, design database 320 can include one or more processors and/or displays.

While similar in structure, value change database 330 can be configured or be capable of being configured to store information received from custom prototype board 230. For example, value change database can be configured or be capable of being configured to store information related to signal values captured by signal probes associated with verification modules 251a and 251 b. In accordance with some embodiments I/O devices 340 can be one or more of a mouse, stylus, key device, audio input/output device, imaging device, printing device, display device, sensor, wireless transceiver, or other similar device. I/O devices 340 can also include devices that provide data and instructions to memory 310, processor 300, design database 320, or value change database 330.

In accordance with some embodiments, interfaces 350 can include external or integrated interface device or interface port, such as PCI Express, Ethernet, FireWire®, USB, and wireless communication protocols. For example, interfaces 350 can be a PCI Express device coupled to communicate with emulation interface 220 using host communication channel 215. I/O devices 340 can also include a graphical user interface, or other humanly perceivable interfaces configured to present data.

Figure 4:
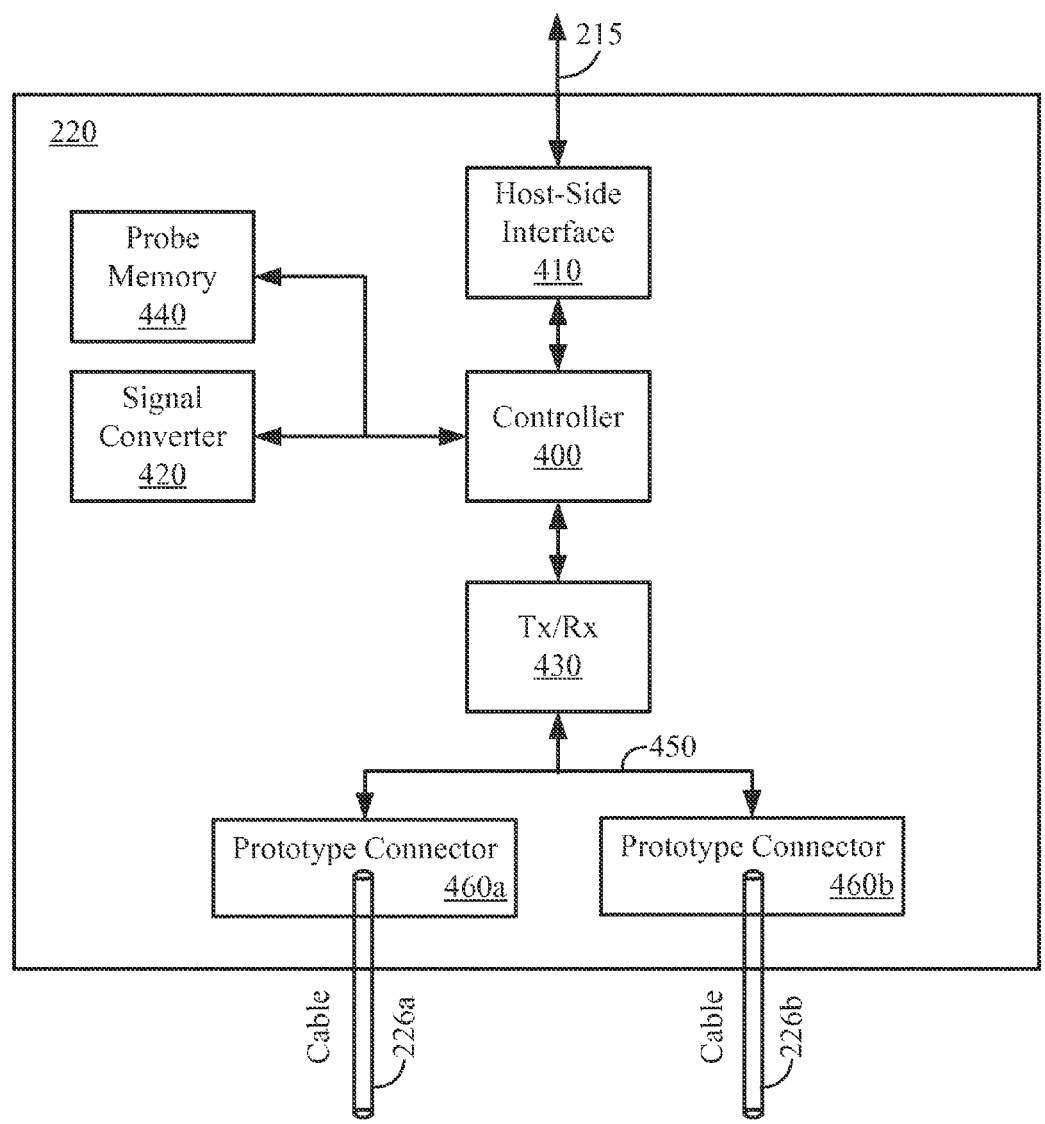
FIG. 4 is a block diagram illustrating a block diagram of an exemplary emulation interface consistent with disclosed embodiments.

FIG. 4 illustrates a block diagram of an exemplary emulation interface 220 consistent with disclosed embodiments. By way of example, and as illustrated in FIG. 4, emulation interface 220 can include one or more of host-side interface 410, controller 400, signal converter 420, probe memory 440, transceiver 430, and prototype connectors 460a and 460b.

Host-side interface 410 can be similar to interfaces 350 and configured or be capable of being configured to facilitate communication with host workstation 210 using host communication channel 215. In other embodiments, host-side interface 410 can be different from interfaces 350, and can include physical or logical signal conversion components to facilitate communication with host workstation 210.

In accordance with some embodiments, controller 400 can be a component similar to processor 300. In some embodiments, controller 400 can act upon data or instructions received from host workstation 210 through host-side interface 410, signal converter 420, or custom prototype board 230 through transceiver 430 and at least one of prototype connectors 460a and 460b. For example, controller 400 can exchange commands and data with one or more verification modules 251 (for example, one or more of 251a and 251b) to control and monitor a device state associated with one or more of FPGA devices 250a and 250b. In some embodiments, the data can be signal values associated with probed signals. In other embodiments, controller 400 can send commands or data to at least one of verification modules, 251a and 251b, causing the at least one of verification modules to modify, among other things, the amount of data captured and the number or type of signals probed. As shown in FIG. 4, controller 400 can be coupled to receive data or instructions from probe memory 440 and transceiver 430. In some embodiments, controller 400 can, for example, act upon instructions to send timing and control information to verification modules, 251a and 251b, located in each FPGA chip, 250a and 250b, on custom prototype board 230. Instructions can include, but are not limited to, configuration parameters and runtime control information received from host-side interface 410.

Timing and control information can include, but is not limited to, commands and data associated with probing signals to gather time-based or state-based information associated with a device or device state. Timing information can include clock signals generated, received, or processed by controller 400. Timing signals can also include start, stop, and reset signals. Received by verification module 251 (at least one of 251a and 251b), timing information can serve as basis to probe, capture, and process timing and state analysis data associated with a device under test. For example, timing and control information sent by controller 400 can provide a basis for creating a trigger sequence, capturing data from the device under test, assigning a time reference to captured data, sampling signal values, and configuring one or more signals within FPGA 250 (at least one of 250a and 250b) to be used as a clock when performing state analysis. In some embodiments, controller 400 can be configured or be capable of being configured to store data captured from FPGA chips, 250a and 250b, in probe memory 440. In some embodiments, the data received from FPGA chips, 250a and 250b, can be encoded. In some embodiments, the data received from FPGA chips, 250a and 250b, can be received from verification modules, 251a and 251b. Data can include timing data, state data, and meta data associated with the captured data. Meta data can include, among other things, a time reference or signal name. Captured data associated with a particular signal or signals stored in probe memory 440 can be compared to data associated with the same signal, but captured at a later time. In some embodiments, controller 400 can also be configured or be capable of being configured to encode and/or decode data exchanged with one or more verification modules 251a and 251b located in each FPGA chip, 250a and 250b.

Signal converter 420 can include a processor specifically configured or be capable of being configured to convert data exchanged over transceiver 430 into a suitable format for processing by host workstation 210.

Transceiver 430 can include any appropriate type of transmitter and receiver to transmit and receive data from custom prototype board 230. In some embodiments, transceiver 430 can include one or a combination of desired functional component(s) and processor(s) to encode/decode, modulate/demodulate, and to perform other functions related to the communication channel between emulation interface 220 and custom prototype board 230. Transceiver 430 can be coupled to communicate with custom prototype board 230 over emulation interface communication channel 450. In some embodiments, emulation interface communication channel 450 can, for example, utilize TDM (time-division-multiplexing) to exchange data with custom prototype board 230.

Prototype connectors 460a and 460b can be a J-connector or other connector type with signal transmission properties suitable to exchange commands and data between controller 400 and custom prototype board 230. Prototype connectors 460a and 460b can be configured or be capable of being configured to receive corresponding J-connector compatible cables 226a and 226b, respectively. In some embodiments, emulation interface 220 can include greater than or less than two prototype connectors in accordance with the particular system requirements. Emulation interface 220 can be configured or be capable of being configured to enable various logical configurations, both predefined and configurable, to physically connect to FPGA chips 250a and 250b.

Returning to FIG. 2, exemplary custom prototype board 230 can be a pre-fabricated or customized test device suitable for testing the design under test implemented in one or more FPGA chips 250a and 250b. By way of example, and as illustrated in FIG. 2, custom prototype board 230 can include one or more FPGA devices 250a and 250b, coupled to communicate with emulation interface 220 through connectors 222a and 222b, and 260a and 260b. Although depicted as two connectors, connectors 222 and 260 can be as few as one or more connectors, such as a J-connector or similarly suitable connector. Similarly, although depicted as including two FPGA devices 250a and 250b, custom prototype board 230 can have one or more FPGA devices 250 in accordance with the particular system requirements.

Figure 5:
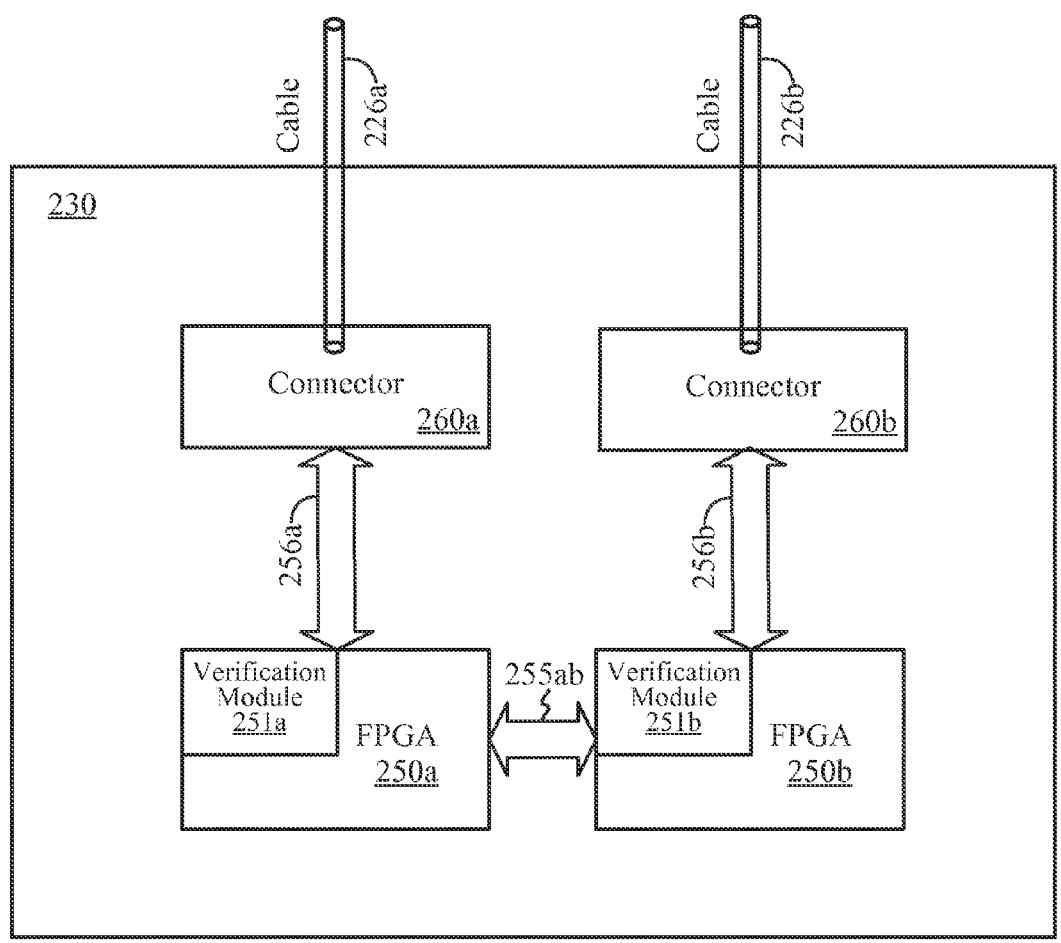
FIG. 5 is a block diagram illustrating a block diagram of an exemplary custom prototype board consistent with disclosed embodiments.

FIG. 5 illustrates custom prototype board 230 in more detail. By way of example, as illustrated in FIG. 5, custom prototype board 230 can include FPGA chips 250a and 250b, connectors 260a and 260b, interconnections 256a and 256b, and interconnections 255ab. Embodiments in accordance with custom prototype board 230 can be open systems in the sense that custom prototype board 230 can be customized in accordance with customer's specifications by, for example, custom designing interconnections 256a and 256b, and interconnections 255ab. Custom prototype board 230 can contain various numbers of FPGA chips (for example, FPGA chips 250a-250n) whose pins are interconnected in customer preferred configurations. In addition, custom prototype board 230 can contain a number of connectors 260a and 260b, which are connected to FPGA chips 250a and 250b according to a user's choice and in a user's preferred configurations. Embodiments in accordance with these aspects can utilize custom prototype board 230 by describing custom designed interconnections, and other custom configurations in user generated device description files.

In some embodiments, FPGA chips 250a and 250b pass along two clock signals to emulation interface 220. These two clocks are probe sampling system clock and probe sampling reference clock. The probe sampling system clock is used to support TDM (time-division-multiplexing) for probed signal values; and the probe sampling reference clock is used to designate a user clock period in which the sampling of signals to be probed constitutes a snapshot of a state in the circuit design while operating. The probe sampling reference clock is used by controller 400 in emulation interface 220 to write the collected probe signal values into probe memory 440, and also to determine the next trigger state.

The probe sampling system clock and probe sampling reference clock are generated in one or more FPGA chips 250 (FPGA chips 250a and 250b) on custom prototype board 230, and are routed to verification module 251 (the corresponding verification module from 251a and 251b associated with the selected FPGA chip from 251a and 251b), then through appropriate FPGA pins to connector 260 (the corresponding connector from 260a and 260b associated with the selected FPGA chip from 251 and 251b), the cable 226 (the corresponding cable from 226a and 226b associated with the selected FPGA chip from 251a and 251b), and finally onto emulation interface 220. In some embodiments, both the probe sampling system clock signal and the probe sampling reference clock signal are passed to controller 400 of emulation interface 220. Controller 400 on emulation interface 220 might only need one FPGA on custom prototype board 230 to propagate the two clock signals and hence, any FPGA on custom prototype board 230 can provide the clocks, and in some embodiments, the first FPGA chip encountered in the device description files is chosen for this purpose.

In accordance with some embodiments, verification module 251 can include at least one of instrumentation circuitry and logic modules configured or be capable of being configured to perform traditional logic analysis instrumentation functions. Logic analysis functions performed by verification module 251, can include, for example, sampling of signal values, state analysis, protocol analysis, and triggering. In some embodiments, verification module 251 can be synthesizable or soft intellectual property (IP). Configuration parameters defining verification module 251 can be set during the design verification setup process, such as in a manner similar to flows for programming FPGA chips 250a and 250b. For example, during setup in some embodiments, the setup flow can automatically integrate third party synthesis and place and route tools, automatically or manually partition a design, and construct a design database for runtime software usage. A setup flow can include, for example, an automatic process for a pre-partitioned design, where the register transfer language (RTL) partitioning tool includes either a third party tool or a user's own manual partitioning. Alternatively or additionally, a setup flow can also include a flow where the user's design is not manually partitioned at the RTL level. In some embodiments, verification module 251 can be defined by Hardware Description Language (HDL) code and further verification module 251 can be merged with a partitioned portion of a circuit design to form an image data that can be downloaded to at least one of FPGA chips 250a and 250b. In some other embodiments, verification module 251 can be defined by netlist descriptions.

To optimize the physical pin resources available in a particular custom prototype board 230, verification module 251 comprises both design-dependent and design-independent circuitry. Throughout the detailed description, verification module 251 can refer to at least one of the verification modules 251a and 251b. For example, verification module 251 can include a design-dependent circuit, configured or be capable of being configured to connect to and probe specific signals. A probe or signal probe can include circuitry configured to analyze or sample the state of a particular signal. Utilizing access to design database 320 associated with the device under test, data dependent circuitry can be reconfigured during a test process to modify, remove, or add probes. In some embodiments, design database 320 can identify the signals to be probed by verification module 251 and also can identify the frequency of monitoring those signals to be probed. Verification module 251 can also include design-independent circuits configured or be capable of being configured to encode and decode data. For example, data-independent circuits can include, among other circuit types, first input first output (FIFO) and control state machine for sending data captured by verification module 251 to at least one of controller 400 and host workstation 210 for processing. Configuration parameters defining verification module 251 can be set during the design verification setup process.

Operationally, verification module 251 can respond to configuration parameters set during setup process or modified during testing. Based on these parameters, verification module 251 captures and sends a full design state snapshot of the portion of the device under test, performs cycle-to-cycle analysis, and/or performs the required emulation. Data captured by verification module 251 can be post-processed by a computing device or component, such as emulation interface 220 or host workstation 210. Post processing can include, but is not limited to, timing, state, and protocol analysis. Prior to processing data captured by verification module 251, captured data can be stored in value change database 330. In other embodiments, captured data can be stored in value change database 330 after processing.

Figure 6:
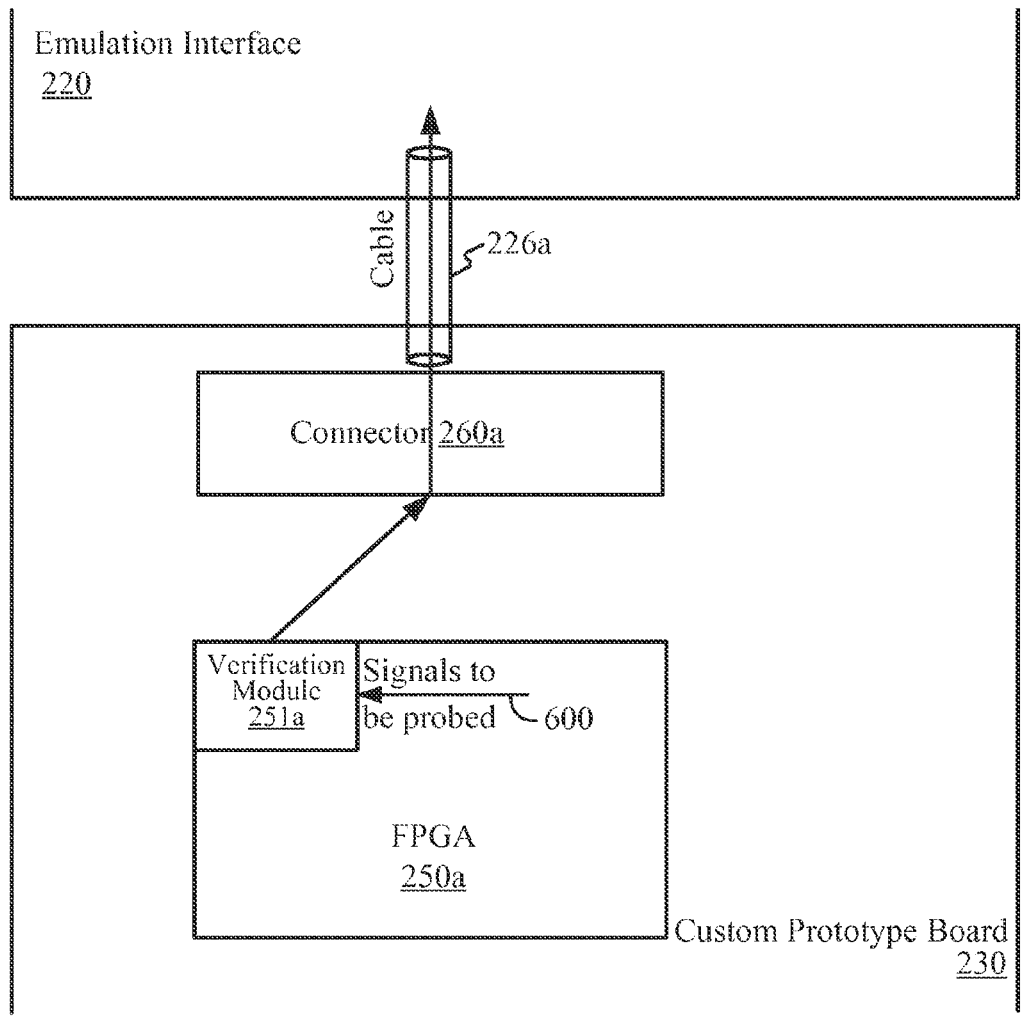
FIG. 6 is a block diagram illustrating a block diagram of an exemplary signal data path consistent with disclosed embodiments.

FIG. 6 shows signals 600 to be probed which are coming from portions of user design in FPGA chips 250a and 250b on custom prototype board 230, and are transmitted to emulation interface 220. Signals 600 to be probed are sampled and passed on to emulation interface 220 by verification modules 251a and 251b. The device description files are referenced when verification modules 251a and 251b are created during setup flow. In FIG. 6, probe signals 600 are coupled with verification module 251a of FPGA 250a, and verification module 251a is configured or be capable of being configured in accordance with the device description files such that sampled probe signals 600 are propagated to appropriate FPGA pins of FPGA 250a, which then can travel through the connector 260a, cable 226a, and arrive at their destination in emulation interface 220.

In some embodiments, device description files describe, among other things, interconnections 256a and 256b and also interconnections 255ab of custom prototype board 230. FIG. 7 shows an example of device connectivity description in Verilog HDL. In some other embodiments, the device connectivity description can be described in other HDLs like VHDL. VHDL, as known by one skilled in the art, is an HDL and stands for VHSIC Hardware Description Language The first line of the device description file of FIG. 7 is a module declaration, and is the top level view of custom prototype board 230. In the example device description file of FIG. 7, the module is named "custom_device." The module name is not relevant and a user can change it to any preferred name. The I/O ports of the module, for example, connector1_pins and connector2_pins as shown in FIG. 7 are relevant to the description of custom prototype board 230. These are the pins corresponding to FPGAs, 250a and 250b, which are connected via cables 226a and 226b to emulation interface 220, and the pin order of the module has to match the order of actual connections between cables 226a and 226b with emulation interface 220. So, for example, if cables 226a and 226b connecting connectors 260a and 260b with connectors 222a and 222b are switched, then connector1_pins and connector2_pins in the module definition of the device description file would also be switched. In some embodiments, cables, 226a and 226b can be used to couple custom prototype board 230 containing the at least one FPGA with emulation interface 220 and the cable connections can be described by the device description files.

As can be seen in the second line and third line of the module, the connector ports are declared, for example, as "inout [119:0]," comprising 120 pins each, and are of In-Out type. As known by the one with ordinary skill in the art, In-Out type pins have the capability to act as either input or output pins. The number of pins on each connector, 260a and 260b, of custom prototype board 230 matches the number of pins on each connector, 222a and 222b, of emulation interface device 220. Each pin of connectors 260a and 260b is declared as In-Out type because each pin on FPGA 250a and 250b can be either an input pin or output pin depending on the configured images generated by the setup software at setup time. As described above, connector pins of connectors 222a and 222b also are defined as In-Out to match their counterparts on custom prototype board 230. Another reason for declaring connector pins as In-Out type is to not clutter the device description files by keeping them shorter, as understood by one skilled in the art. The I/O ports, connector1_pins and connector2_pins also correspond to the signals in interconnections 256a and 256b respectively. In addition to the I/O ports, device description files also include interconnections between FPGA chips on custom prototype board 230, for example interconnection 255ab corresponding to interconnection between FPGA 250a and FPGA 250b, which can be defined as local signals. As an example, device description file in FIG. 7 defines local_sig1 and local_sig2 as two interconnections between FPGA 250a and FPGA 250b. Even though only two local signals are defined in this exemplary embodiment, a user can define as many interconnections between FPGA chips as physically present on custom prototype board 230 for interconnecting FPGA pins.

The body of the device description file as exemplified in FIG. 7 comprises instances of FPGA chips. For example, the exemplary embodiment as illustrated by FIG. 7 shows two FPGA instances, F1 and F2, which are of FPGA type xc5vlx330, corresponding to FPGA 250a and 250b of custom prototype board 230. The type of FPGA chips used can be defined in a separate device description file as illustrated in FIG. 8. Referring back to the exemplary device connectivity description of FIG. 7, pins on each FPGA instance, F1 and F2, are connected to connectors or other FPGA chips. Declarations of I/O ports, instances and connections on instance pins and I/O ports together constitute a complete description of device level connectivity and FPGA resources. By consulting the device description files, as exemplified by FIGS. 7 and 8, setup software can prepare configured images that can be downloaded to the FPGA chips on custom prototype board 230 to emulate the user design. In some embodiments, the configured images can be created by place and route software associated with at least one of FPGA 250a and FPGA 250b.

The device level connectivity as illustrated by the device description file illustrated in FIG. 7 is an aspect of custom prototype board 230. Other information pertaining to custom prototype board 230, as illustrated by FIG. 8 may also be included. An example is FPGA device type. For this purpose, a separate file may be used, such as the one shown in FIG. 8. Custom_device.F1 is a hierarchical instance name, and is referring to the F1 instance in the Verilog tile of FIG. 7. The following line describes the device type of custom_device.F1 as xc5vlx330-ff1760. This information can signify whether the type of FPGAs used, for example, is a member of Xilinx™ Vertex family or a member of Altera™ Stratix family. From this device type description, the setup software can know the characteristics of the FPGA chip on custom prototype board 230, and will generate the configured image accordingly. In some embodiments, the device description file as exemplified by FIG. 8 are not in a hardware description language like Verilog or VHDL.

Before running emulation of circuit design, the configured images are downloaded to FPGA chips, 250a and 250b, on custom prototype board 230. In some embodiments, the user designs custom prototype board 230 such that it has its own download bus, which might mean that emulation interface 220 need not be involved in downloading the configured images. In other embodiments, where a dedicated download bus is not included on custom prototype board 230, a connector, such as a dedicated connector, in emulation interface 220 can be used for this purpose. In some embodiments, device description files can include description of the download bus or the special connector. In other embodiments, the download bus or the special connector is not described in device description files. Instead, the user can use a runtime command to tell the prototype system 200 whether the configured image data is to be downloaded into custom prototype board 230 either using its own download bus or the special connector of emulation interface 220.

The current disclosed embodiments provide users with great freedom in customizing their prototype board designs to suit their needs. In addition, the disclosed embodiments offer users flexibility in other aspects, such as, for example, re-cabling. In some situations, a given FPGA (for example, either 250a or 250b) on custom prototype board 230 can connect to more than one connector 260a and 260b. As an example, FPGA 250a can connect to emulation interface 220 through connectors 260a and 260b. The user has the freedom of using a cable (for example, cable 226a or 226b) to connect one of the connectors on each FPGA to emulation interface 220, and describe the connectivity in device description files that reflects the cabling accordingly. Later, if the user needs to switch a cable to a different connector, say, to make room for mounting some custom parts on the device, it is straightforward to do so. The user can modify the description in the device description files to reflect the change in cabling, and re-run the setup flow to update the custom prototype system configuration. By referencing the new description in the device description files, the setup flow will automatically configure a new image data for downloading. Likewise, if the user would like to swap cables, it can also be done in a similar manner.

In some embodiments, a user can increase the number of signal probes on an FPGA, for example, FPGA 250a through cabling. If the user has originally connected only one connector (for example, 260a) on FPGA 250a to emulation interface 220, and later decided to probe more signals on FPGA 250a, probing the additional signals can be accomplished by connecting a second connector, for example, 260b (and its corresponding connector 222b on emulation interface 220) from emulation interface 220 to FPGA 250a. Then, the user can simply modify the connectivity description in the device description files, and re-run setup to generate updated configured images and send them to FPGA 250a for emulation. Note that in some situations, using a second cable to connect a second connector to emulation interface 220 can only be accomplished by unplugging a cable from some other FPGA on custom prototype board 230.

Figure 9:
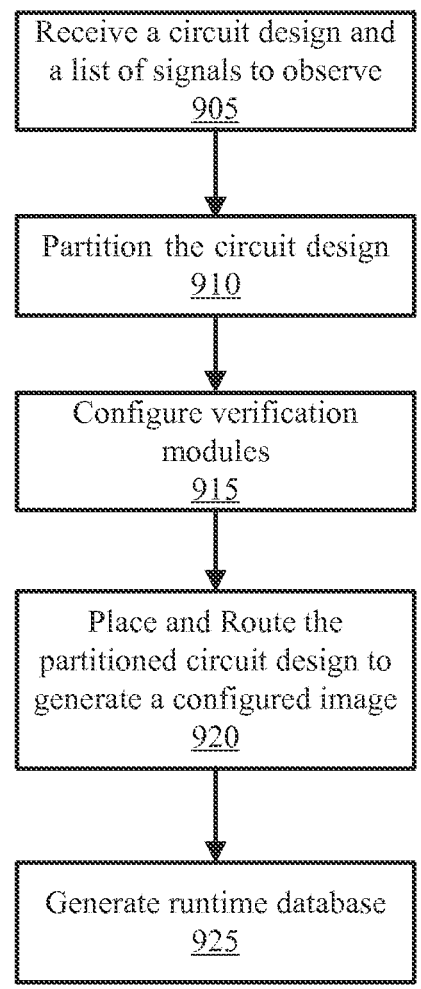
FIG. 9 is a flowchart illustrating an exemplary method of setting up a prototype system consistent with disclosed embodiments.
Figure 10:
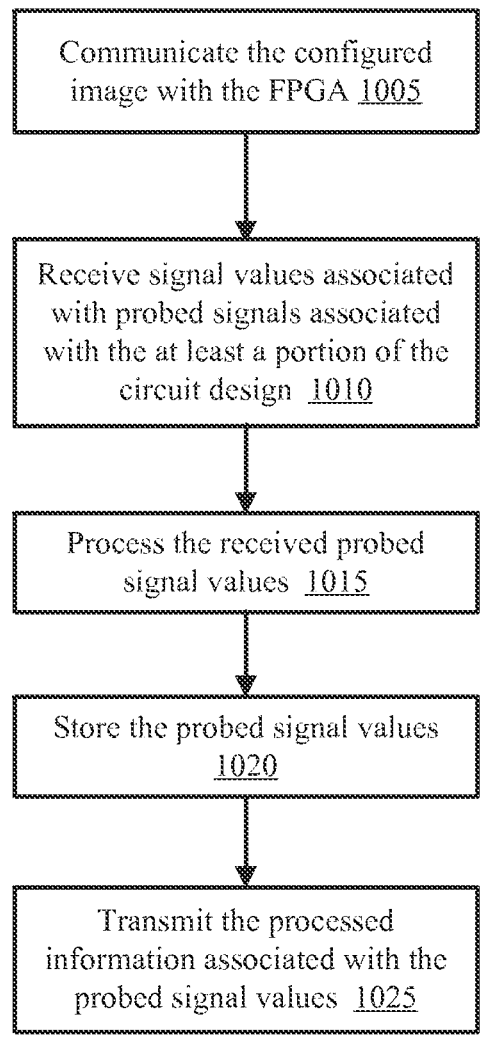
FIG. 10 is a flowchart illustrating an exemplary method of operating a prototype system consistent with disclosed embodiments.

FIG. 9 depicts a setup flow chart, and FIG. 10 depicts a runtime flowchart. The setup flow represents an exemplary method performed by a host workstation for configuring image data representative of at least a portion of a circuit design to be emulated by a custom prototype system. The runtime flow of FIG. 10 generally follows the setup flow in one embodiment. Starting with downloading FPGA images to the custom prototype board, the runtime flow shows an exemplary custom prototype system emulating the circuit design, receiving, processing and storing probed signal values, and then uploading to the host workstation for further processing and debugging. While the flowchart discloses the following steps in a particular order, some of the steps can be moved, modified, or skipped in various embodiments and depending on the applications.

The host workstation, in step 905, can be configured or be capable of being configured to receive at least a portion of the circuit design to be emulated on the customer prototype board and a list of signals to probe. In some embodiments, the received circuit design can be a portion of, such as one or more blocks of a System-On-Chip (SOC) design and in other embodiments it can be the whole SOC design. The list of signals are signals to be probed at runtime, for example, for debugging purpose.

The host workstation can comprise a software program comprising a series of instructions embodied on a computer-readable medium of the host workstation, the software program being configured or be capable of being configured to provide, when executed, to at least one field programmable gate array ("FPGA") on the custom prototype board, runtime control information and image data representative of at least a portion of the circuit design to be emulated and an verification module, the image data based at least in part on information in at least one device description file.

An emulation interface can be configured or be capable of being configured to be coupled between the host workstation and the custom prototype board, the emulation interface being configured or be capable of being configured to provide timing and control information to at least a first portion of at least one FPGA implementing at least a portion of the circuit design and the verification module based on at least one image data and runtime control information received from the host workstation through a host interface. In some embodiments, the interface can be configured or be capable of being configured to provide timing and control information to at least a verification module associated with the at least one FPGA. In some embodiments, the interface can comprise a controller and a memory, the memory being configured or be capable of being configured to store probed signal values from at least a portion of the at least one FPGA implementing at least a portion of the emulated circuit design, wherein the verification module can be configured or be capable of being configured to provide the probed signal values, and the controller can be configured or be capable of being configured to receive and process the probed signal values. In some embodiments, timing information can include clock signals generated from or processed by the emulation interface component. In some embodiments, control information can include information associated with an analysis trigger sequence or condition. Control information can include, but is not limited to, commands associated with creating signal probes for analysis of selected signals.

After receiving at least a portion of circuit design, in step 910, the design is partitioned into smaller portions of circuit design such that each of the smaller units can fit in an FPGA chip on the custom prototype board. The partition step is based on the following information including, among others, device description files and user constraints. Board description files can describe the connectivity information of the custom prototype board and can also describe the various interconnections between different FPGAs on the custom prototype board and also interconnections between each FPGA and the emulation interface. In some embodiments, the device description file can comprise at least one of Verilog description and VHDL description.

Board description files can also describe, among others, the type of FPGAs and the number of FPGAs used on the custom prototype board. User constraints can at least include probe signal names, probe sampling system clock name, probe sampling reference clock name, probe sampling system clock rate, probe sampling reference clock rate, target system clock rate, etc. Each partitioned unit of the circuit design can be assigned to a specific FPGA chip on the custom prototype board, and can to be combined with a specific verification module, which can be created and configured or be capable of being configured in step 915, to form a downloadable image for the specific FPGA chip.

After partitioning the circuit design, in step 915, the verification module can be generated, wherein the verification module can be configured or be capable of being configured to control at least a portion of the emulated circuit design and to receive and monitor signals to be probed representing internal states of the portion of the emulated circuit design. For example, controlling the device under test can include setting value or sampling of a predetermined set of signals to be probed based on timing information received from the emulation interface. In some embodiments, sampling can be performed synchronously. In other embodiments, sampling can be performed asynchronously. In some embodiments, the verification module can be defined by HDL code, and merged with a partitioned portion of a circuit design to form an image data that can be downloaded to at least one FPGA chip. In some other embodiments, the verification module can be defined by netlist descriptions, such as EDIF.

The verification modules sample signals to be probed and transmit the sampled signals to the appropriate pins of the FPGA chip and then to the corresponding pins of the connector coupled with the FPGA chip and later to the emulation interface for processing. In some embodiments, time division multiplexing (TDM) can be employed to improve the speed of passing on the sampled signals to the emulation interlace, which also enables the custom prototype system to increase the number of signals to be probed it can pass on in a given time. In some embodiments, probe signal values are supplied to the controller by at least a second portion of the at least one FPGA of the custom prototype board, and at least one probe sampling system clock signal and at least one probe sampling reference clock signal are supplied to the controller by at least a third portion of the at least one FPGA.

In some embodiments, the emulation interface can be configured or be capable of being configured to receive commands from the host workstation to reconfigure the functionality of the verification modules. In reconfiguring the functionality of the verification modules, the emulation interlace, can send commands received from the host workstation operable to reconfigure the number, type, and manner in which signals to be probed can be analyzed based on circuit design information included in the design database. In other embodiments, the emulation interlace can send commands received from the host workstation operable to reconfigure a portion of the circuit design separately or in addition to commands leading to the reconfiguration of the verification module.

The verification module can monitor predetermined signals to be probed within the device under test. For example, the verification module can include probes configured to analyze one or more signals to be probed. Alternatively or additionally, the verification module can capture information representative of a device state associated with the device under test. For example, the verification module can include a design-dependent circuit, equipped with probes to capture data associated with specific signals to be probed. Utilizing access to the design database associated with the device under test, the verification module can be reconfigured during a test process to modify, remove, or add probes to capture the same or different signals to be probed. In some embodiments, the design database can identify the signals to be probed by the verification module and also can identify the frequency of monitoring those signals to be probed.

Configuration parameters defining the verification module can be used to determine which signals can be probed. These parameters can be set during the design verification setup process. Alternatively, the verification module can be modified during testing. Based on these parameters, the verification module can capture and send a full design state snapshot of the device under test, perform cycle-to-cycle analysis and capture, perform co-simulation or co-emulation, and incrementally modify which signals are probed. Alternatively or additionally, data captured by the verification module can be processed by a computing device or component, such as the emulation interface or the host workstation. In some embodiments, a portion of the verification module can either receive or transmit at least one of the signals to be probed, at least one of the probe sampling system clock signals, and at least one of the probe sampling reference clock signals.

In step 920, the partitioned circuits and verification modules go through a place and route (P&R) flow, which refers to mapping of the netlist that is partitioned and inserted with the verification module, to registers, memories, interconnects, and pins of the target FPGA on the custom prototype board. The P&R flow is based on information from device description files and partitioned net lists.

In step 925, a first configured image representative of at least a portion of the circuit design and an verification module is generated. This first configured image is based at least in part on the first set of descriptions between the at least one FPGA and the emulation interface and also based on the information in the device description files. In some embodiments, the first configured image comprises a number of signals to be probed to be controlled and monitored by the custom prototype system.

The runtime flow is depicted in FIG. 10. In step 1005, the first configured image is communicated to at least one of the FPGAs of the custom prototype board. In some embodiments, a pre-existing image representative of at least another portion of the circuit design is communicated to another FPGA of the custom prototype board. Pre-existing images, if any, are also communicated to their associated FPGAs of the custom prototype board in step 1005.

In step 1010, the signal values associated with probed signals from the verification module are received at the emulation interface, wherein the probed signal values are associated with at least a portion of the circuit design being emulated. The emulation interface can be coupled to the custom prototype board through the at least one connector and the emulation interface can be configured or be capable of being configured to provide timing and control information to at least a portion of the custom prototype board. The emulation interface can further comprise a controller and a memory device, wherein the controller can be configured or be capable of being configured to receive and process the probed signal values. In step 1015, the received probed signal values are processed by the controller of the emulation interface. Next, in step 1020, the probed signal values are stored in the memory device of the emulation interface. In step 1025, the processed information associated with the probed signal values is transmitted from the emulation interface to the host workstation.

To illustrate the setup and runtime process as depicted in FIGS. 9 and 10, an exemplary embodiment is described below. For example, a custom prototype board comprising two FPGA chips may be used in one embodiment. A circuit design to be emulated may be received, in step 905, as a Verilog text file, for example, "MyDesign.v" in one embodiment. The text file, "MyDesign.v," can be partitioned, in step 910, into two files, "MyDesignSub1.v" and "MyDesignSub2.v," and each may contain a part of the circuit design to be emulated. As an example, the circuit design may include a CPU and a Codec. The circuit descriptions may be initially specified in the text file, "MyDesign.v." In some examples, a user may partition the circuit design such that the circuit descriptions associated with the CPU can be in FPGA 1 and that of the Codec can be in FPGA 2, such that the descriptions for the CPU in "MyDesign.v" can be included in "MyDesignSub1.v," and the remaining descriptions, presumably for the Codec, can be included in "MyDesignSub2.v."

Next, additional circuit descriptions, serving as verification modules, can be added into "MyDesignSub1.v," and "MyDesignSub2.v," which can provide timing and control information to the FPGA 1 and FPGA 2, respectively. The additional circuit descriptions can also include probe signal values in CPU and Codec respectively, which can be communicated with the emulation interface, e.g., an Interface Card. The additional descriptions are for defining or describing "Verification Modules." For example, the additional circuit descriptions of the "MyDesignSub1.v," file can be referred as "Verification Module 1," and that of "MyDesignSub2.v," as "Verification Module 2." In some embodiments, "Verification Module 1" can be different from "Verification Module 2," because "Verification Module 1" works with the CPU portion, and "Verification Module 2" works with the Codec portion. The verification modules, "Verification Module 1" and "Verification Module 2," can be configured or be capable of being configured in step 915.

Next, in steps 920 and 925, the partitioned circuit design as illustrated by, "MyDesignSub1.v" (comprising the CPU and Verification Module 1) and "MyDesignSub2.v" (comprising the Codec and Verification Module 2) can go through a host software or application, such as a Place and Route software, to generate two downloadable binary images, for example, "MyDesignSub1.bin," and "MyDesignSub2.bin," which may be representative of the circuit to be emulated.

Next, in step 1005, the two images can be respectively communicated to FPGA 1 and FPGA 2 on the custom prototype board. For example, "MyDesignSub1.bin" can be downloaded into FPGA 1 and "MyDesignSub2.bin" can be downloaded into FPGA 2. In step 1010, the signal values associated with probed signals from the verification modules, for example, "Verification Module 1" and "Verification Module 2," are received (e.g., read, accessed, or otherwise retrieved) by the emulation interface, wherein the probed signal values are associated with at least a portion of the circuit design being emulated. In step 1015, the received probed signal values, associated with "MyDesign.v," are processed by the controller of the emulation interface. Next, in step 1020, the processed probed signal values, associated with "MyDesign.v," are stored in the memory device of the emulation interface. In step 1025, the processed information associated with the probed signal values, associated with "MyDesign.v," can be transmitted from the emulation interface to the host workstation.

Figure 11:
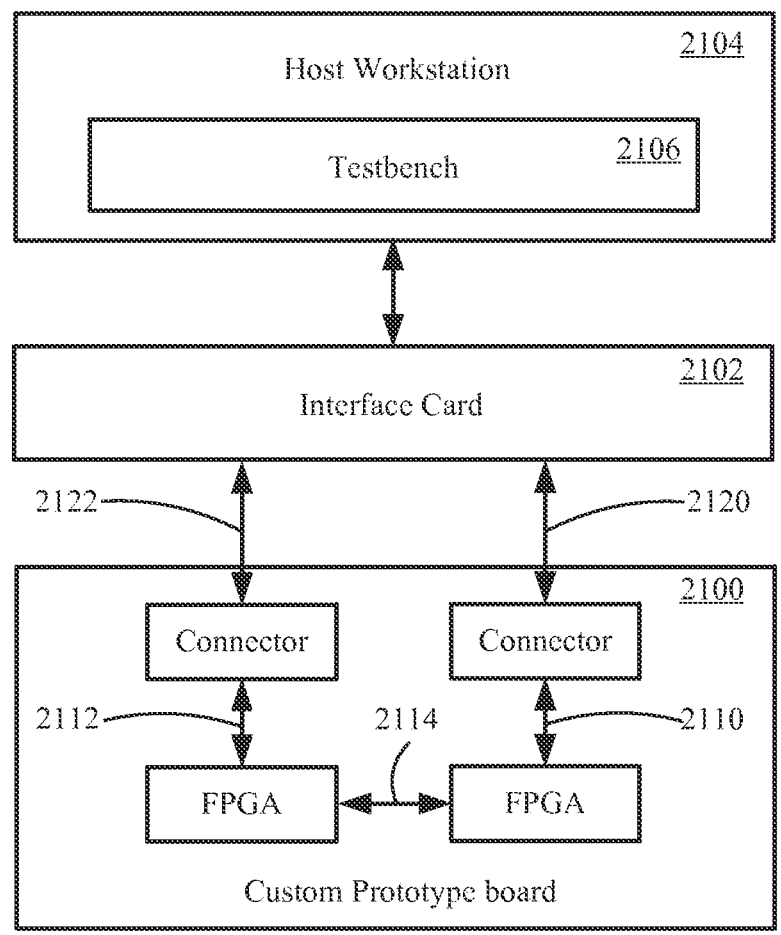
FIG. 11 is a schematic diagram of a system integrating a custom prototyping device adapted to run co-simulation and co-emulation consistent with disclosed embodiments.

FIG. 11 is a schematic diagram of a system integrating a custom prototyping device adapted to run co-simulation and co-emulation, in accordance with some embodiments. In some embodiments, the system of FIG. 11 includes one or more aspects of the systems described above. For example, the system of FIG. 11 may be used to implement the methods described above with reference to FIGS. 9 and 10. The system of FIG. 11 is shown as including a testbench 2106 running on a host workstation 2104, a custom prototype board 2100, and an interface device 2102, such as a board or a card, adapted to connect the testbench 2106 to custom prototype board 2100. The custom prototype board 2100 is shown as including 2 FPGA devices and 2 connectors that are in communication with the interface device 2102 through cables 2120 and 2122. In order to describe the custom prototype board, a set of device description files, such as the device description files described above, are provided. The set of device description files describe, among other things, the FPGA device types, the wire connections 2114 connecting the FPGA devices, as well as wire connections connecting the pins of the FPGA devices to the pins of the connectors 2110 and 2112. Accordingly, after the device description files are set up, the footprint of the device and the type of components on the device are known.

Figure 12:
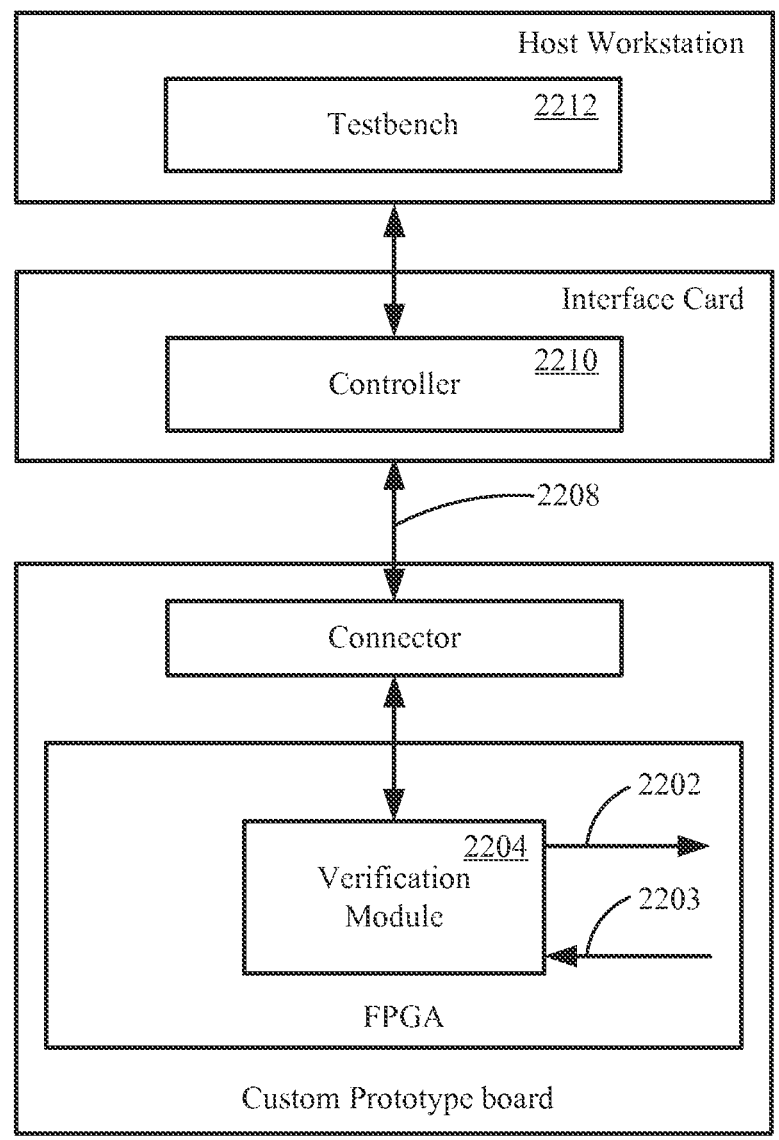
FIG. 12 is a block diagram illustrating data paths between primary input signals, primary output signals and the testbench running on a host workstation of FIG. 11 consistent with disclosed embodiments.

FIG. 12 shows the data paths between primary input signals 2202, primary output signals 2203, and testbench 2212 running on a host workstation. In one embodiment, values for primary input signals 2202 originating from testbench 2212 are communicated to a controller 2210 disposed on an interface device. The controller 2210 communicates these signals to the FPGA(s) disposed on verification module 2204 of the user's custom prototype board. Verification Module 2204 then communicates the primary input signals to the part of the user design on the same FPGA. Primary output signals 2203 follow an opposite path. Verification Module 2204 collects the primary output signals from the part of a user design on the same FPGA, and communicates them to the controller 2210 on the interface device. The controller 2210 on the interface device then communicates those signals to the testbench 2212.

During co-simulation, primary input signals are communicated to the user design within the FPGA devices. Then, a clock edge is communicated to the prototype board, which may update the states of certain register elements and memory elements in the FPGA devices. Subsequently, primary output signals are communicated to the testbench running on the host workstation. These steps are repeated for each active clock edge until the co-simulation completes.

The device description files may be referenced when verification modules are created at the setup time. In FIG. 12, primary input signals 2202 and primary output signals 2203 are connected to associated verification modules 2204. The verification modules are configured in accordance with the device description files such that primary input and output signals are routed properly to the connector pins that are connected to the interface device through cables 2208. FIG. 12 shows only one FPGA in communication with the controller however it is understood, however, that any number of FPGAs may be used. In one embodiment, the configuration shown in FIG. 12 is duplicated for each FPGA on the custom prototype board. Therefore, the controller 2210 first receives the primary input signals from host workstation. The controller then communicates the signals associated with the verification modules on the FPGAs concurrently to reduce the time needed to distribute the primary input signals to the user design in FPGA devices, thereby improving the co-simulation speed. Likewise, the controller 2210 receives the primary output signals concurrently from each verification module on each FPGA. The controller 2200 then combines the received output signals to form a complete set which it subsequently delivers to the host workstation in one batch. The parallelism for transmitting primary input and output signals between multiple FPGA devices and the controller speeds up the co-simulation.

Moreover, advantageously, since the controller is separate from the custom prototype board, competition with the user design for valuable FPGA resources on the prototype board is eliminated. Furthermore, the controller may play different roles in different operating modes, such as prototyping, co-simulation, etc.

Co-Simulation Clocks

During co-simulation, clock edges that can cause state changes for register elements or memory elements in the user design are communicated from the testbench via the controller to FPGA devices on the custom prototype board. Although there are multiple FPGA devices on the custom prototype board, the controller may be configured to deliver the clocks to a subset of the FPGA devices, for example, to only one FPGA chip. The receiving FPGA chip(s) may buffer the received clock signals, and then distribute them evenly to all FPGA devices via on-device clock tree circuitry.

Figure 13:
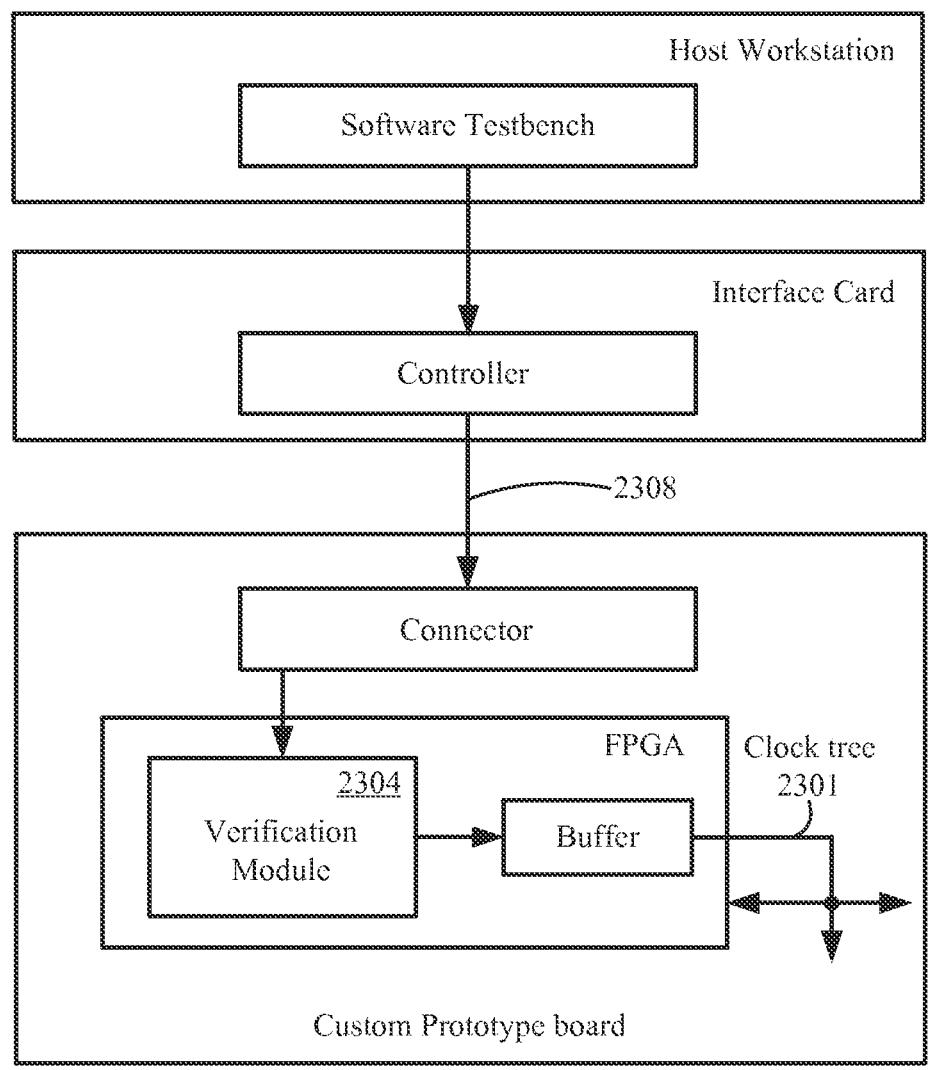
FIG. 13 is a block diagram illustrating a system integrating a custom prototyping device adapted to run co-simulation and co-emulation and deliver a clock signal from a testbench to an on-device clock tree consistent with disclosed embodiments.

FIG. 13 is a schematic diagram of a system integrating a custom prototyping device adapted to run co-simulation and co-emulation and deliver a clock signal from a testbench to an on-device clock tree via the controller and a corresponding verification module, in accordance with one embodiment. From the device description files, setup software can recognize the on-device clock tree 2301, and generate the verification module 2304 accordingly.

Co-Simulation Setup

Figure 14:
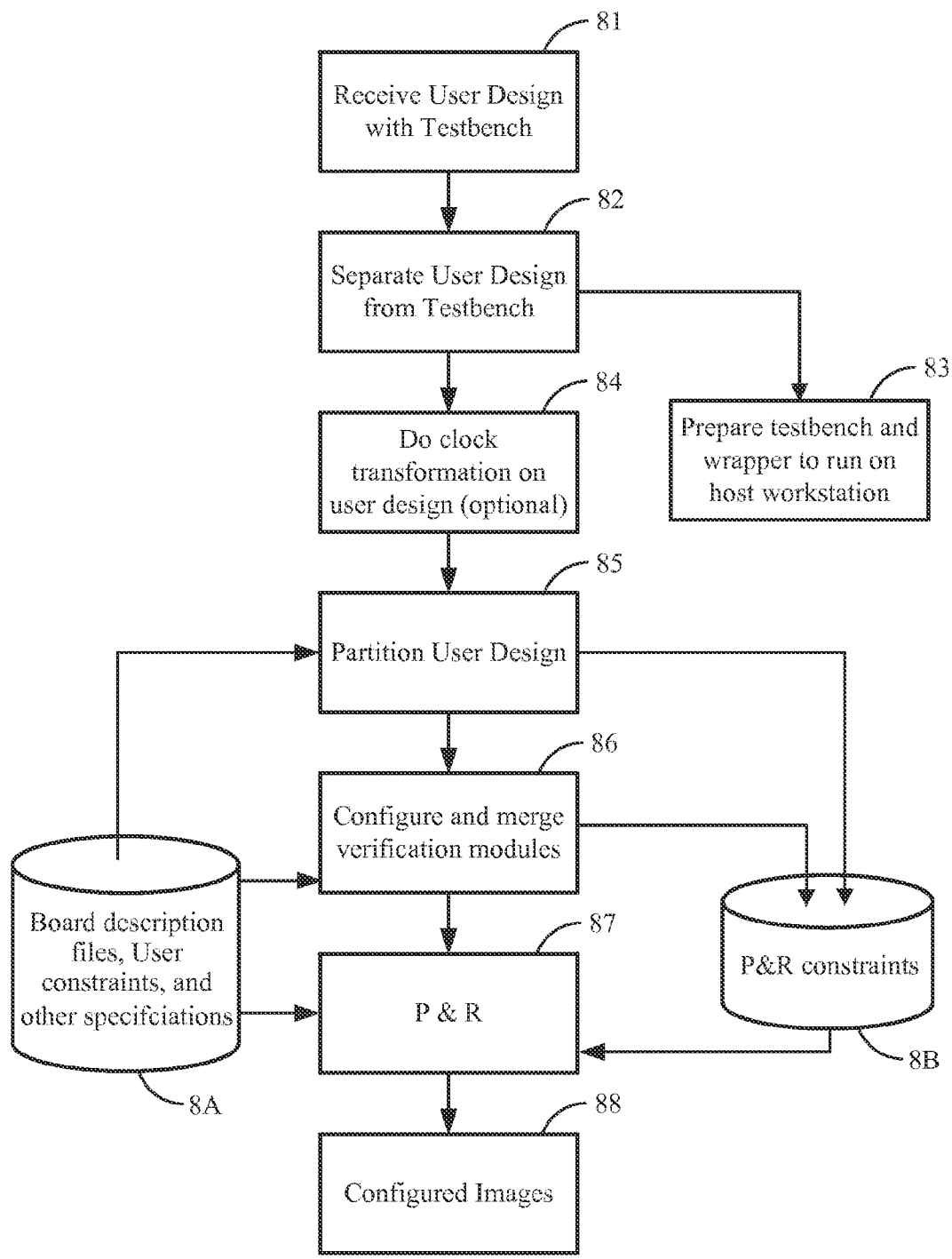
FIG. 14 is a flowchart diagram illustrating a method of performing co-simulation consistent with disclosed embodiments.

FIG. 14 is flowchart illustrating an exemplary flow of co-simulation, in accordance with one embodiment. A user design along with its testbench is received at 81. The testbench is then separated from the user design at 82. The separated testbench and a wrapper are run on a host workstation at 83. The wrapper running on the host workstation collects and delivers primary input and output signals between the testbench and the user design via the controller and the associated verification modules. The wrapper also delivers clock edges to the user design in between each sampling and delivery of primary input and output signals.

The separated user design then optionally transforms clock signals to address hold time anomalies in the user design at 84. At 85, the user design is partitioned in accordance with the device description files so that each partitioned portion of the user design can fit in a specific FPGA on the custom prototype board. At 86, verification modules specific to each partitioned portion of user design are generated and configured in accordance with the device description files 8A. Verification modules may receive and communicate primary input signals from the controller to the associated portions of the user design, and may also collect and communicate primary output signals from the associated portions of the user design to the controller. The verification modules route primary input and output signals to appropriate connector pins in accordance with the device description files.

Place and route (P&R) is then performed on the partitioned portions of the user design along with generated verification modules at 87. P&R may be performed in accordance with the constraints 8B generated at partition time and verification module generation time. At 88, the result of P&R is a downloadable image which can be used to configure an FPGA device on the custom prototype board. The configured images are ready to download prior to co-simulation runs.

Vector Mode

FIG. 12 shows the data paths for primary input and output signals during co-simulation with a testbench running on the host workstation in one embodiment. In one example, the primary input signal values may be pre-generated on a cycle-by-cycle basis. For example, the cycle-by-cycle input signal values may be saved from previous co-simulation runs or software-based simulation runs, or they may come from existing golden sets. Alternatively, a separate program may be written to create the cycle-by-cycle values for the primary input signals.

Figure 15:
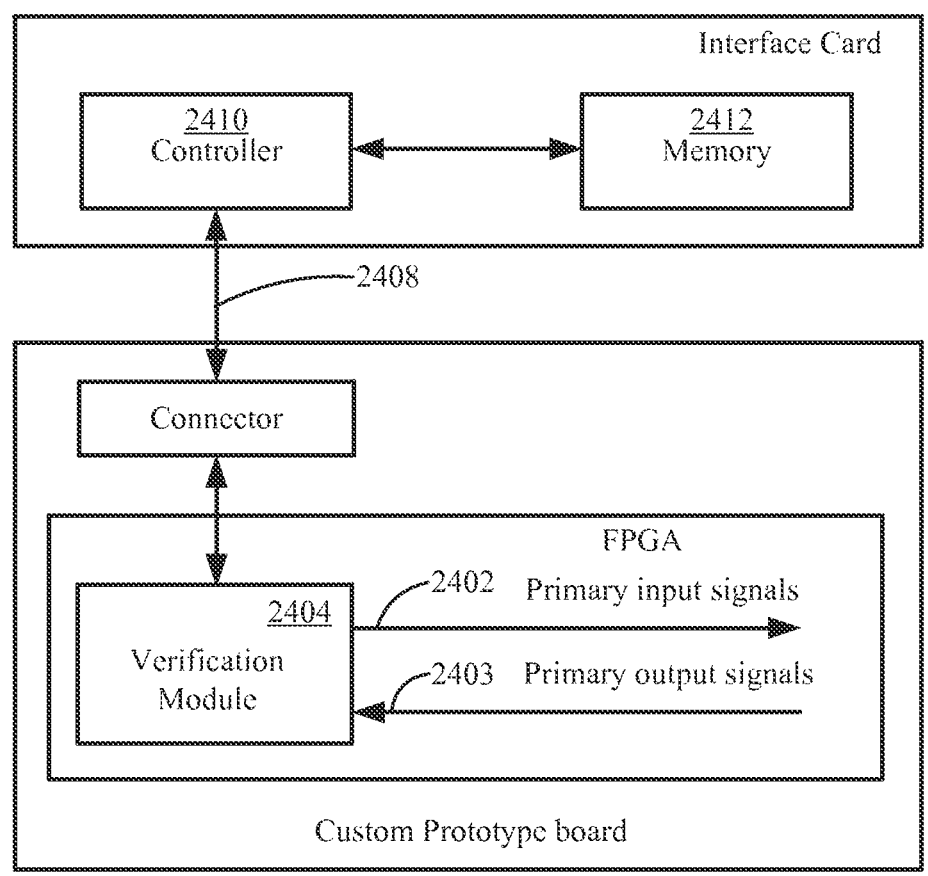
FIG. 15 is a block diagram illustrating an example of a data path for pre-generated input vectors stored in a memory disposed on the interface device consistent with disclosed embodiments.

FIG. 15 is a schematic diagram of an embodiment having an interface device, such as a board or a card, connected to a custom prototype board. The pre-generated, cycle-by-cycle, primary input signal values, which may be called "input vectors", may be downloaded and kept in memory 2412 on the interface device in one embodiment. Controller 2410 is configured to fetch the input vectors from memory 2412 and communicate the input vectors to verification modules 2404 one vector at a time, for example, in the same or similar way as is practiced during co-simulation in which the controller receives primary input signal values from testbench running on the host workstation. Clock signals may be "tagged" to the input vectors so that they can communicate to the controller which clock edge is to apply after the current vector is delivered to the primary input signals 2402 of the user design.

When running in the vector mode, several options for handling the primary output signal values 2403 exist. A first option is to discard the signal values and rely on signal probing for debugging purposes or the behavior of target devices to determine if the emulation is successful (for example, as described further below). A second option is to store the primary output signal values 2403 in memory 2412 disposed on the interface device using controller 2410. The stored values may be uploaded to the host workstation at the end of vector mode emulation. A third option is to generate a "signature" from the collected primary output signal values, and report the signature to the host workstation at the end of co-simulation. In some embodiments, the signature includes a compressed version of the collected primary output signal values. The waveform signature generation may be done in the controller or in the associated verification modules 2404.

Co-simulation speed can be limited by the back and forth process of exchanging primary input and output values between the user design in FPGA devices and the testbench running on the host workstation on clock edges. Such a co-simulation may run at a rate of thousands of cycles per second or less. In contrast, vector mode can run at, for example, at a rate of millions of cycles per second. At such speeds, it is possible to use the prototyping device to drive target devices or systems at or near real time speeds, thus enabling the user to rely on the behavior of the target devices/systems to determine if the design is working correctly. In such systems, the primary output values may be discarded during the vector mode emulation.

At millions of cycles per second running in vector mode, the user can also use the same probing technique used in prototyping systems for debugging purposes. To accomplish this, only a portion of memory 2412 on the interface device is used to store input vectors. The rest is reserved for storing probed signal values at runtime. The trigger mechanism supported by controller 2410 for prototyping systems is equally applicable in vector mode. The saved probe signal values can be uploaded to the host workstation at the end of emulation for further analysis.

Vector Mode Setup

Vector mode setup may be similar to the co-simulation mode setup. One difference is that the testbench may not be run on the host workstation side. The user can start with the setup flow for co-simulation, run co-simulation, save input vectors and clock edges cycle-by-cycle in a file, and then turn to vector mode using the saved input vectors and clock edges.

SCEMI

SCEMI, which stands for Standard Co-Emulation Modeling Interface, is proposed by the Accellera standards organization. SCEMI 2.0 was released in 2007.

SCEMI is a convention for message passing between software components running on the host workstation and hardware transactors that wrap the user design on the emulation hardware. It raises the communication from signal level to transaction level between the host workstation and the emulator hardware, thereby improving the co-simulation speed.

Figure 16:
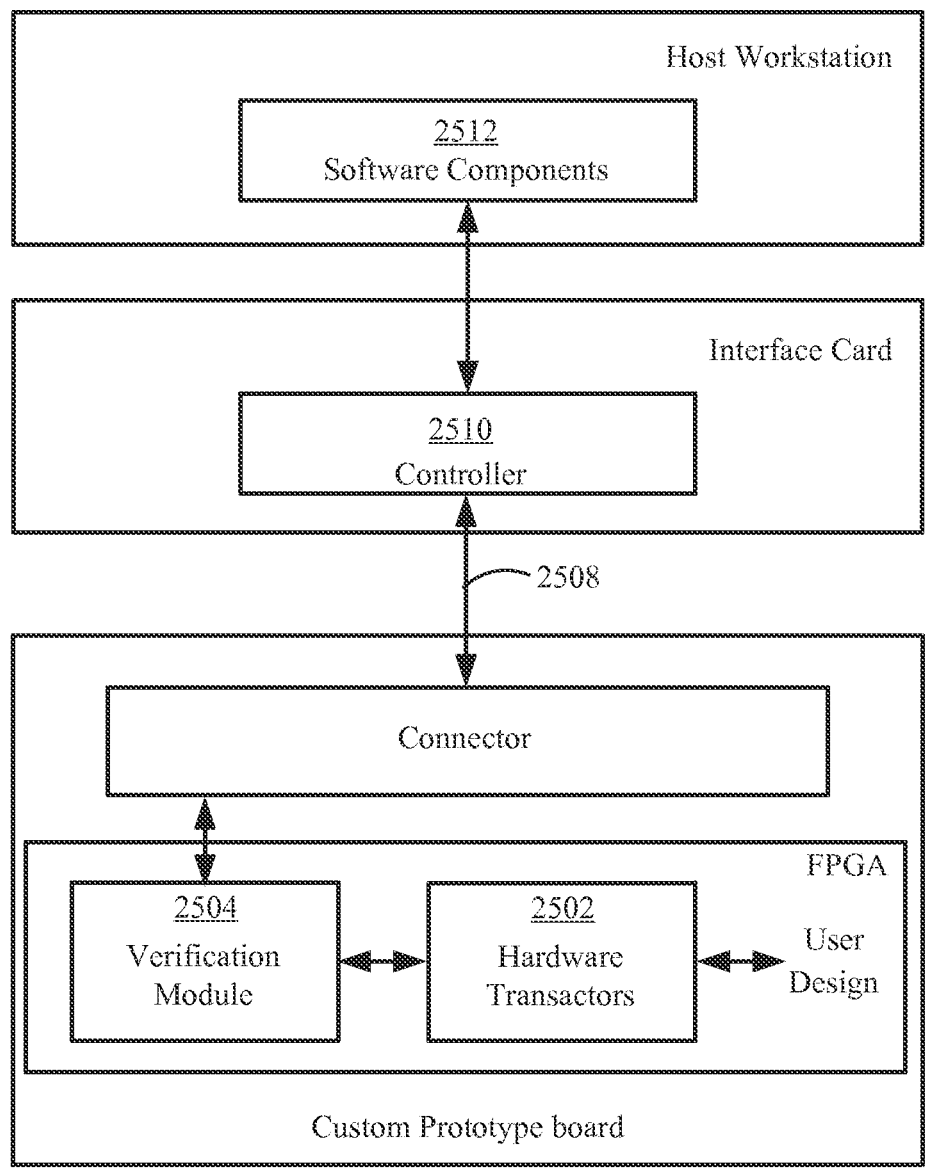
FIG. 16 is a block diagram illustrating a system integrating a custom prototyping device adapted to run co-simulation and co-emulation with the custom prototyping device running in the SCEMI mode consistent with disclosed embodiments.

FIG. 16 is a schematic diagram of an embodiment of a system running SCEMI on a custom prototyping device. Software components 2512 run on the Host Workstation side in one embodiment. They exchange messages with hardware transactors 2502 that wrap the user design in FPGA. Messages travel through the controller 2510, cable 2508, connector and verification module 2504. Messages may be sent from software components to hardware transactors, or they may be sent from hardware transactors to software components. When sending a message, clocks on the custom prototype board may be suspended, and may be resumed after the message has been sent. The user design and the hardware transactors run on clocks generated on the custom prototype board. Therefore, when clocks are not suspended, the FPGA devices on the custom prototype board are running on clocks generated by the prototype board, which typically range in millions of cycles per second. In some embodiments, the probing scheme, described above for vector mode, which utilizes the memory and the controller on the interface device may be used in the SCEMI mode.

SCEMI Setup

As in the case for co-simulation, during the setup for SCEMI based co-emulation, may be the verification modules are generated according to custom device description files. The infrastructure implemented in the controller and the generated verification modules enable the message exchange scheme at SCEMI runtime.

Transactors and associated verification modules work in tandem. When a transactor wants to send or receive a message, it may want to suspend clocks in coordination with the associated verification module. Since clocks in SCEMI are typically generated on a FPGA and evenly distributed to all FPGA devices via the on-device clock trees, when the verification module needs to suspend clocks on behalf of a transactor, it may need to propagate the request to the FPGA responsible for clock generation. During setup, the device description files are consulted so that appropriate signal lines are designated for this purpose.

Target device running at, or close to, full speed.

In conventional systems, the speed of any extension components or target devices that a user may plug in is limited by the emulation system vendor's device design. Such a speed limitation is especially severe when running co-simulation or co-emulation on proprietary devices with target extensions. In accordance with the embodiments, these speed limitations are overcome. Since, users have complete freedom in designing their own FPGA devices and target interfaces, the custom designed target interfaces and FPGA devices can continue to run at, or close to, prototyping speed while running in vector mode or SCEMI mode.

Figure 17:
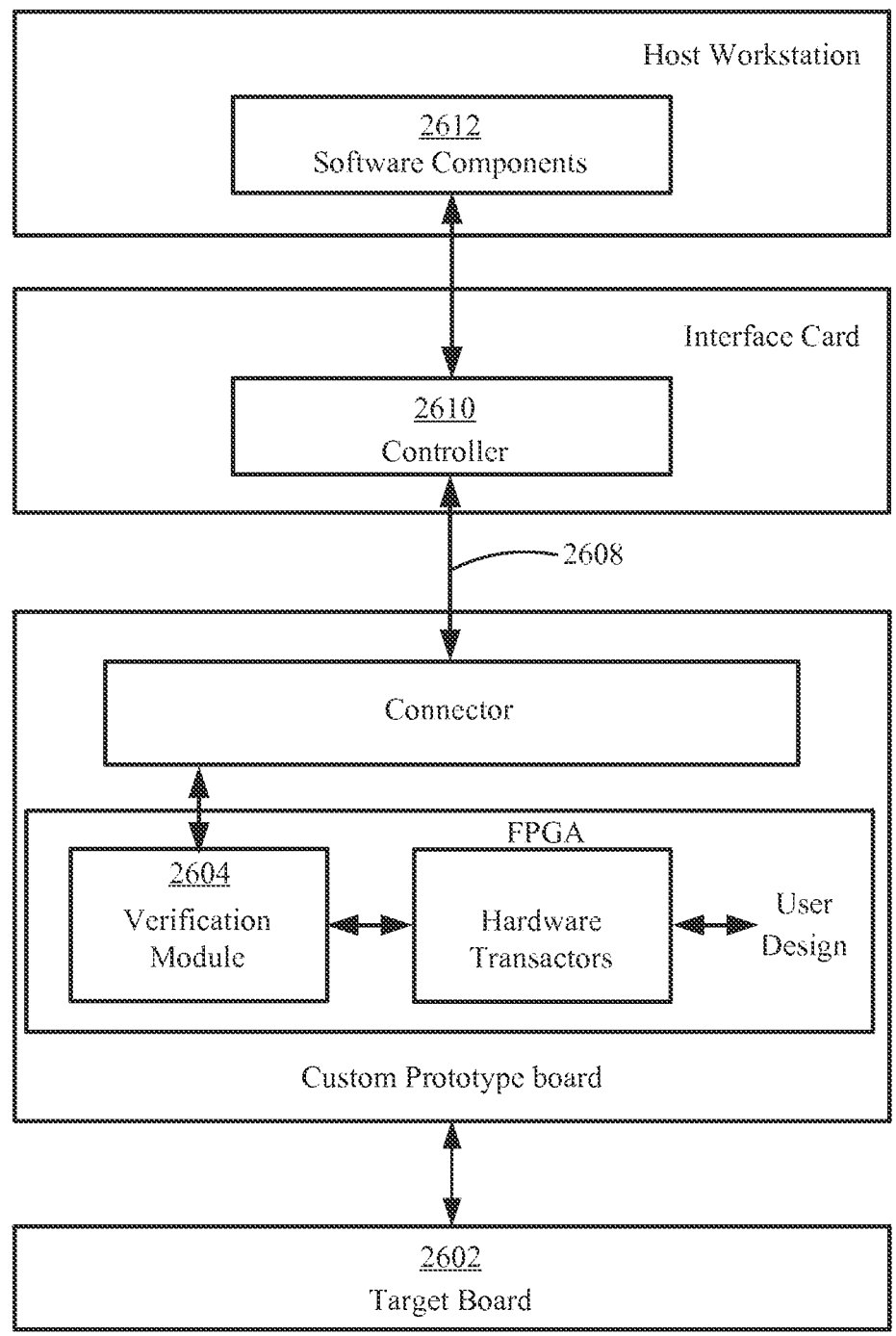
FIG. 17 is a block diagram illustrating a system integrating a custom prototyping device adapted to run co-simulation and co-emulation with target device running in the SCEMI mode consistent with disclosed embodiments.

FIG. 17 is a schematic diagram of an embodiment of a system integrating a custom prototyping device adapted to run co-simulation and co-emulation with target device running in the SCEMI mode. Target Board 2602 is connected to the custom prototype board via custom designed target interfaces. For prototyping, the target device can achieve the speed that the user demands. The same speed can be maintained in the SCEMI mode as long as the clocks are not suspended during message passing. This unique flexibility can be achieved on an "open" system in which users have freedom in designing their own prototyping devices and target interfaces.

In FIG. 17, Target Board 2602 is shown as being separate from the custom prototyping device. Although not shown, in other embodiments, the target may be implemented as one or more components mounted on the custom prototyping device. Since the users have complete freedom in designing their own custom prototyping device, they can choose to put the target on a separate device, or to mount it along with FPGA devices on the same prototyping device.

Although the flexibility in the SCEMI mode has been discussed, the same or similar flexibility can be achieved in the vector mode. As described above, the vector mode can run at a relatively very high speed. Thus, the target device speed may be sustainable in the vector mode.

Figure 18:
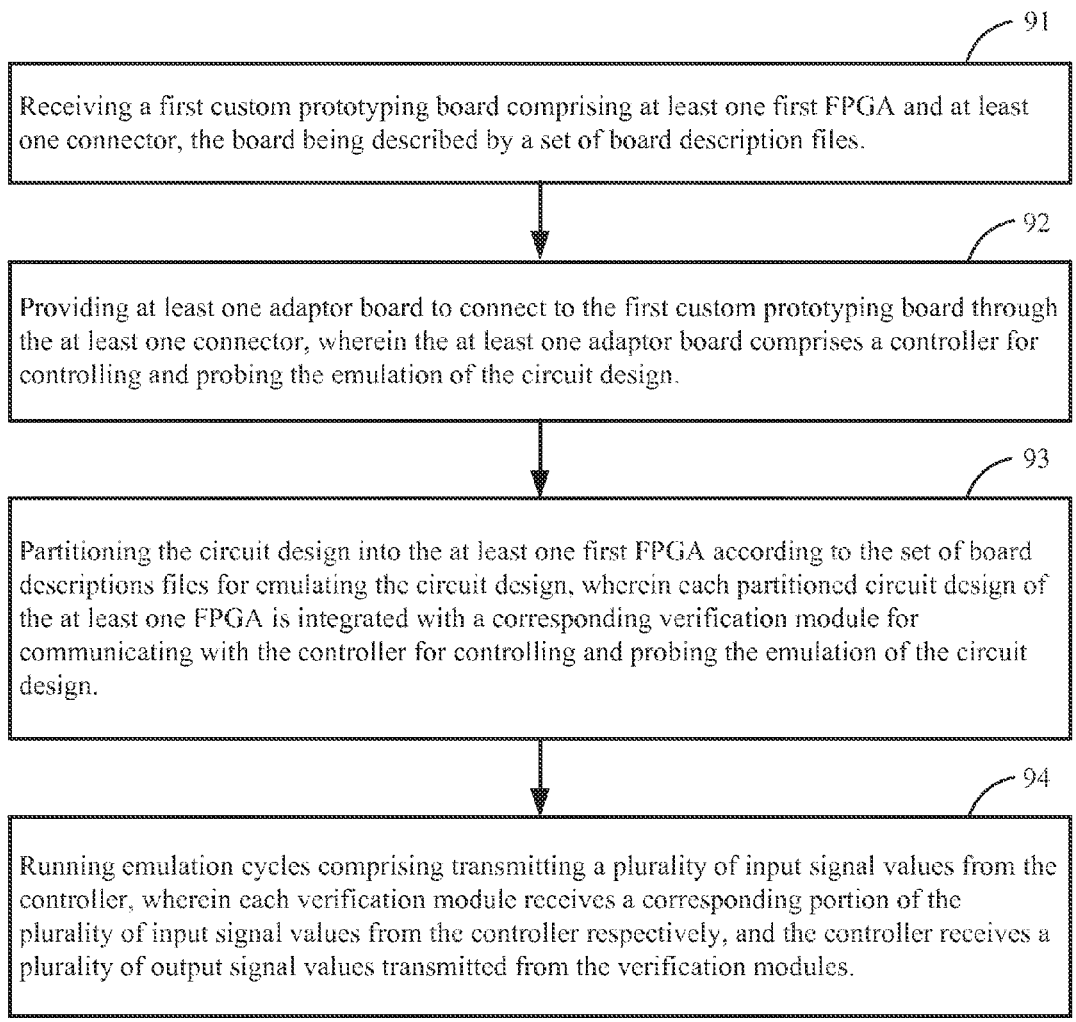
FIG. 18 is a flowchart diagram illustrating a method of integrating a custom prototyping device into an emulation system for emulating a circuit design consistent with disclosed embodiments.

A method of debugging a customer prototype board using emulation may be performed as described above with reference to FIGS. 11-17. FIG. 18 is a flowchart illustrating a method of integrating a custom prototyping device to make an emulation system for emulating a circuit design. At 91, a first custom prototyping device that includes one or more FPGA devices and described by one or more device description files is received. The device description files describe the components and the connections among the components on the first custom prototyping device. For example, if there are three FPGA devices and one connector on the device, the device description files will contain the type of each FPGA and the wire connections among the FPGA devices as well as the wire connections from the pins of the FPGA devices to the pins of the connector. After the device description files are obtained, the footprint of the device and the type of components are known. At 92, at least one adaptor device is provided to electrically couple to the first custom prototype board through connectors. At 93, user's circuit design is partitioned into the FPGA devices according to the device descriptions files for emulating the circuit design. Each partitioned circuit design of the at least one FPGA is integrated with a corresponding verification module for communicating with the controller and for controlling and probing the emulation of the circuit design. Each verification module is generated according to the associated partitioned circuit design and the set of device descriptions files. After the FPGA devices are configured, emulation cycles can be run to emulate and debug the circuit design, as shown at 94. There are different ways to generate test patterns for the FPGA devices on the customer prototyping device. For example, test patterns may be delivered from a test-bench running on a workstation, or they me be fetched from a local memory. Either way, the controller transmits a multitude of input signal values to the verification modules associated with the FPGA devices. Each verification module receives a corresponding portion of the multitude of input signal values from the controller respectively, and passes the received signal values to its associated partitioned circuit in a FPGA device. After an emulation cycle is run, the controller receives a multitude of output signal values from the verification modules. The output signal values transmitted by the verification modules are generated by the partitioned circuits associated with the verification modules in response to the received portions of the multitude of input signal values passed to the partitioned circuits via the verification modules.

In one embodiment, the input signal values transmitted from the controller are generated by a software component running on a workstation in a co-simulation mode. In one embodiment, the controller transmits a multitude of output signal values, generated by combining the output signal values transmitted from each verification module, back to the software component. In another embodiment, the input signal values transmitted from the controller are fetched from a memory device on at least one adaptor device. The controller saves the output signal values transmitted by each verification module in the memory device.

In one embodiment, at least one transactor is integrated with at least one verification module and the corresponding portioned circuit design for co-emulating the circuit design. In one embodiment the transactor and a software component running on a workstation exchange messages. In one embodiment. at least one first portion of the partitioned circuit design is clocked by at a first clock, which is suspended during message passing between the transactor and the software component, and reactivated after the message passing is completed. In another embodiment, a target component is coupled to the partitioned circuit design. The target component, the transactor and a portion of the partitioned circuit design are clocked by a second clock which is not suspended during message passing between the transactor and the software component running on the workstation.

In some embodiments, the methods and features discussed above may be implemented and systems which contain multiple prototype boards, which may be connected and configured in various ways. Some configurations allow multiple design-under-tests to be tested independently, each being tested on one prototype board allocated to it. Some configurations allow one design-under-test to be tested on multiple prototype boards. Some configurations allow a combination of both.

Figure 19:
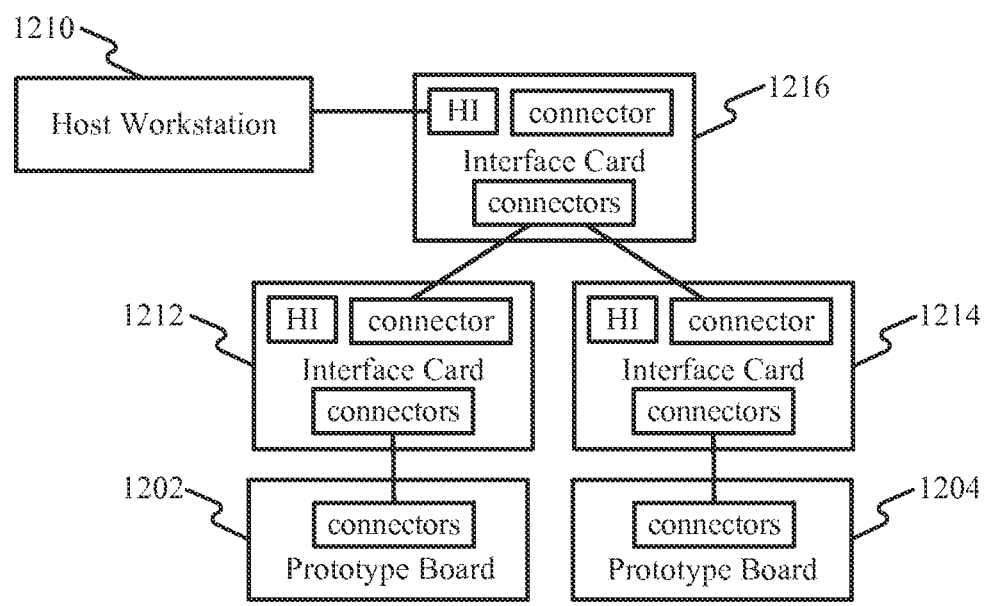
FIG. 19 is a block diagram illustrating an example of a two prototype board system.

In some embodiments, multiple prototype boards are connected to the host workstation by two levels of interface devices. FIG. 19 is a schematic diagram showing an example of a system having two prototype boards 1202 and 1204 connected to the host workstation by interface devices 1212, 1214, and 1216. Each of prototype boards 1202 and 1204 may be the same as or similar to prototype boards discussed above. Interface devices 1212, 1214, and 1216 are configured to receive configuration parameters associated with an image representative of at least a portion of a user design and an associated verification module, for example, as discussed above. Interface devices 1212, 1214, and 1216 are configured to provide the image of a first device under test, for example, as discussed above. Interface devices 1212, 1214, and 1216 are also configured to provide timing and control information to the associated verification module based on the image and the runtime control information from the host workstation 1210.

Interface devices 1212 and 1214 are respectively connected to prototype boards 1202 and 1204 via connectors. Interface device 1216 is connected to interface devices 1212 and 1214. For ease of discussion and illustration in the description that follows, interface devices 1212 and 1214 may be referred to as Level 1 interface devices, and interface device 1216 may be referred to as a Level 2 interface device.

Host Interfaces (HI) in interface devices 1212, 1214 and 1216 may be the same as or similar to Host-side Interface 310 shown in FIG. 3 of U.S. patent application Ser. No. 13/025,809. Host interfaces on Level 1 interface devices are not used in one embodiment. For example, HIs on interface devices 1212 and 1214 are not used in some embodiments. The host interface (HI) on Level 2 interface devices may be connected to the host workstation 110.

As described above, prototype boards can be custom-made devices. Furthermore, prototype boards may be mounted in a custom-made chassis (not shown), or backplane interconnect system (not shown), which may have device-to-device interconnects (not shown). Some embodiments support custom devices as well as custom device to device interconnects. In some embodiments, the custom devices and device to device interconnects are described in the device description file and the system description file respectively. In some embodiments, the number of prototype boards is extended. For example, there may be four prototype boards in the system, and five interface devices to connect the four prototype boards and the host workstation.

A multiple prototype board system, such as the exemplary system shown in FIG. 19, can be used to emulate circuit designs, which are too large to fit on a single prototype board. To use the multiple prototype boards system, the circuit design is segmented, as discussed above, such that a first portion of the circuit design is implemented on a first prototype board and a second portion of the circuit design is implemented on a second prototype board. In such a system, the interaction between each of the prototype boards and the Level 1 interface device connected thereto may be similar to the interaction described above between prototype board 230 of FIG. 5 and emulation interface device 220 of FIG. 4. Unlike the systems discussed above, each of the Level 1 interface devices communicates with the host workstation through the Level 2 interface device.

A multiple prototype board system, such as the exemplary system shown in FIG. 19, can likewise be used to perform co-simulations or co-emulations, as discussed above with reference to FIGS. 11-18. To use the multiple prototype boards system, the circuit design is segmented, as discussed above, such that a first portion of the circuit design is implemented on a first prototype board and a second portion of the circuit design is implemented on a second prototype board. In such a system, the interaction between each of the prototype boards and the Level 1 interface device connected thereto may be similar to the interaction described above between the prototype boards and interface devices discussed above with reference to FIGS. 11-18. Unlike the systems discussed above, each of the Level 1 interface devices communicates with the host workstation through the Level 2 interface device.

In the system of FIG. 19, the Level 2 interface device may be configured to provide a fast communication channel between prototype boards. Alternatively, in some configurations, the prototype boards may be connected directly.

In some embodiments, the Level 2 interface device is configured to coordinate timing between the multiple prototype boards. For example, trigger signals, which indicate starting and stopping of the simulations or emulations, starting and stopping of recorded data of simulations or emulations, or storing the probed signals into the memory of the Level 1 interface devices, may be determined by the Level 2 interface device and transmitted to the prototype boards through their respective Level 1 interface devices.

The Level 2 interface device may use probe signals from one or more of the prototype boards to determine the trigger signals.

In some embodiments, each interface device contains a memory similar to memory 440 in FIG. 4. Although the trigger signals may be generated in the Level 2 interface device 1216, the probed signal values, in some embodiments, are not stored in the memory on interface device 1216. Instead, probed signal values may be stored in probe memories of interface devices 1212 and 1214.

Figure 20A:
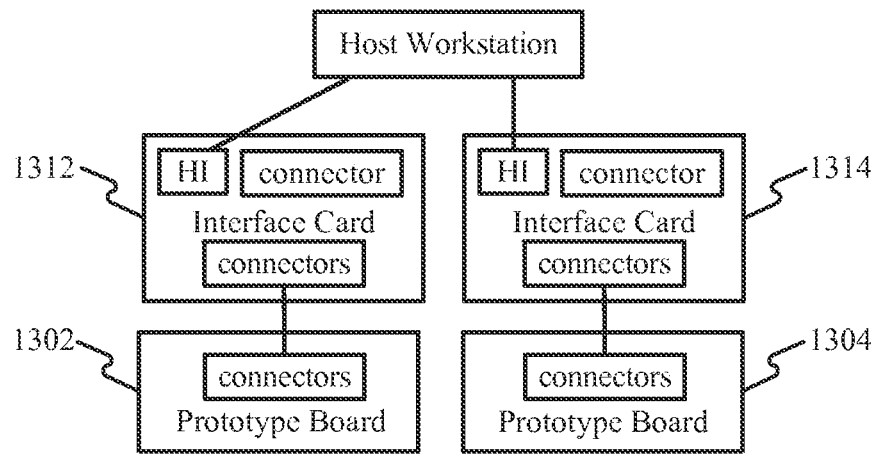
FIG. 20A is a block diagram illustrating an alternative configuration of a two prototype board system in which two prototype boards are connected to the host workstation system via one level of interface devices.

In some embodiments, multiple prototype boards are connected to the host workstation by one level of interface devices. FIG. 20A is a schematic diagram showing an example of a system having two prototype boards 1302 and 1304 connected to the host workstation through host interfaces on interface devices 1312 and 1314. Each of prototype boards 1302 and 1304 may be the same as or similar to prototype boards discussed above. Interface devices 1312 and 1314 are configured to receive configuration parameters associated with an image representative of at least a portion of a user design and an associated verification module, for example, as discussed above. Interface devices 1312 and 1314 are configured to provide the image to a first device under test, for example, as discussed above. Interface devices 1312 and 1314 are configured to provide timing and control information to the associated verification module based on the image and the runtime control information from the host workstation 1210. The system shown in FIG. 20A may also be called a "FPGA-based prototyping" farm, and may be used by multiple users sharing different resources in the system.

A multiple prototype board system, such as the exemplary system shown in FIG. 20A, can be used to emulate circuit designs which are too large to fit on a single prototype board. To use the multiple prototype board system of FIG. 20A for circuit design emulation, the circuit design is segmented, as discussed above, such that a first portion of the circuit design is implemented on a first prototype board and a second portion of the circuit design is implemented on a second prototype board. In such a system, the interaction between each of the prototype boards and the interface device connected thereto may be similar to the interaction described above between prototype board 230 of FIG. 5 and emulation interface device 220 of FIG. 4.

A multiple prototype board system, such as the exemplary system shown in FIG. 20A, can likewise be used to perform co-simulations, as discussed above with reference to FIGS. 11-18. To use the multiple prototype board system of FIG. 20A for co-simulations, the circuit design is segmented, as discussed above, such that a first portion of the circuit design is implemented on a first prototype board and a second portion of the circuit design is implemented on a second prototype board. In such a system, the interaction between each of the prototype boards and the interface device connected thereto may be similar to the interaction described above between the prototype boards and interface devices discussed above with reference to FIGS. 11-18.

In the system of FIG. 20A, the prototype boards may be connected directly to provide a fast communication channel between prototype boards. In some embodiments, the interface devices are programmed to coordinate timing between the multiple prototype boards. For example, trigger signals, which indicate starting and stopping of the simulations or emulations, or starting and stopping of recorded data of simulations or emulations, may be determined before the user design is exercised and programmed in the interface devices. In some embodiments, each interface device contains a memory similar to memory 440 in FIG. 4 so that probed signal values may be stored.

Figure 20B:
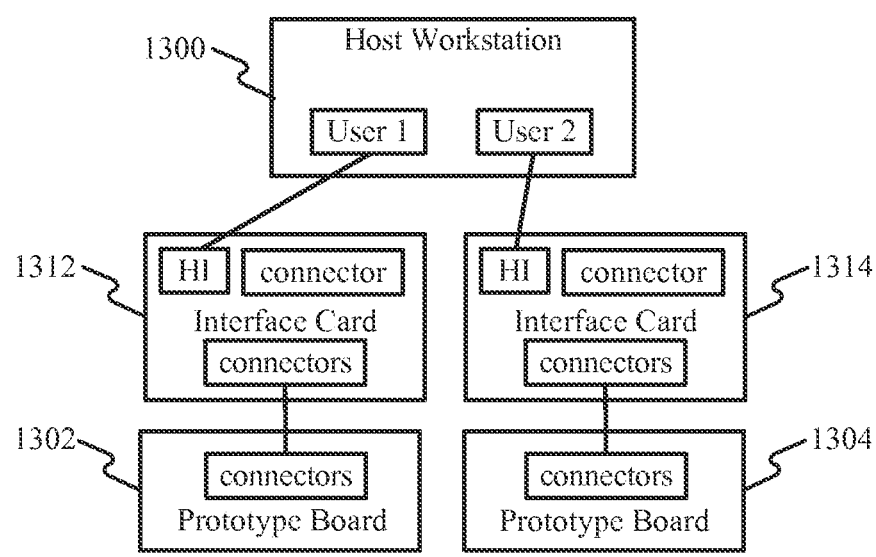
FIG. 20B is a block diagram illustrating use by multiple users.

FIG. 20B is a schematic diagram showing another embodiment of a system having two prototype boards 1302 and 1304 connected to the host workstation through host interfaces on interface devices 1312 and 1314. Each of prototype boards 1302 and 1304 may be the same as or similar to prototype boards discussed above. Interface devices 1312 and 1314 are configured to receive configuration parameters associated with an image representative of at least a portion of a user design and an associated verification module, for example, as discussed above. Interface devices 1312 and 1314 are configured to provide the image to a first device under test, for example, as discussed above. Interface devices 1312 and 1314 are configured to provide timing and control information to the associated verification module based on the image and the runtime control information from the host workstation 1210. In this embodiment, multiple users interface with the prototype boards 1302 and 1304 through the host workstation 1300.

"User 1" process running on Host Workstation 1300 uses interface device 1312, which is coupled to prototype board 1302. "User 2" process running on Host Workstation 1300 uses interface device 1314, which is coupled to prototype board 1304. In this configuration, "User 1" process and "User 2" process can run independently of each other. Moreover, each user has the complete freedom of running prototyping, co-simulation or co-emulation on that portion of hardware resources allocated to him without having to coordinate with other users.

A multiple prototype board system, such as the exemplary system shown in FIG. 20B, can be used to independently emulate first and second circuit designs by first and second users. To use the multiple prototype board system of FIG. 20B for circuit design emulation, the circuit designs are segmented, as discussed above, such that the first design is segmented on a first prototype board and the second design is segmented on a second prototype board. In such a system, the interaction between each of the prototype boards and the interface device connected thereto may be similar to the interaction described above between prototype board 230 of FIG. 5 and emulation interface device 220 of FIG. 4. Each of the users can be independently logged in to the host workstation and interact with one of the prototype boards via the host workstation and the interface device connected with the one prototype board.

A multiple prototype board system, such as the exemplary system shown in FIG. 20A, can likewise be used to independently perform co-simulations on first and second circuit designs by first and second users. The co-simulations can be similar to those discussed above with reference to FIGS. 11-18. To use the multiple prototype board system of FIG. 20B for co-simulations, the circuit designs are segmented, as discussed above, such that the first design is segmented on a first prototype board and the second design is segmented on a second prototype board. In such a system, the interaction between each of the prototype boards and the interface device connected thereto may be similar to the interaction described above between the prototype boards and interface devices discussed above with reference to FIGS. 11-18. Each of the users can be independently logged in to the host workstation and interact with one of the prototype boards via the host workstation and the interface device connected with the one prototype board.

Figure 20C:
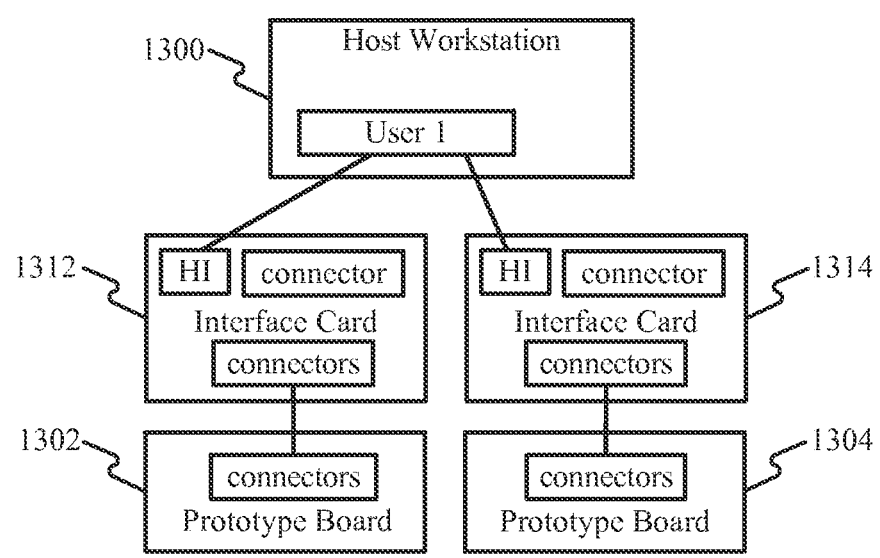
FIG. 20C is a block diagram illustrating one user process using multiple interface devices, each coupled with a prototype board.

FIG. 20C is a schematic diagram showing yet another example of a system having two prototype boards 1302 and 1304 connected to the host workstation through host interfaces on interface devices 1312 and 1314. FIG. 20C illustrates one user process using multiple interface devices, each coupled with a prototype board. In some embodiments, the system of FIG. 20C may be used to perform the functions described above with reference to FIG. 20A. The system of FIG. 20C may be especially suitable for performing co-simulation and co-emulation of large designs, which cannot fit on one prototype board. For example, SCEMI based co-emulation may be suitable for this multiple device configuration. In some embodiments, each prototype board communicates only through the interface device connected thereto. In alternative embodiments, the prototype boards are configured to communicate directly with one or more other prototype boards through communication channels (not shown) between the prototype boards.

If there is no interconnect between the prototype boards directly, different portions of the design running on different prototype boards can use the software program running on the workstation to provide a communication channel. This is known as "software switching", and the speed is typically adequate for co-simulation and co-emulation.

As noted above, systems containing two prototype boards as shown in FIGS. 19, 20A, 20B, and 20C, are discussed as exemplary embodiments. Other embodiments include more than two prototype boards. In a system with more than two prototype boards, for example, configurations shown in FIGS. 20B and 20C can co-exist. For example in a system with three prototype boards, a first user on the workstation may access and operate a first prototype board through a first interface device. At the same time, another user on the workstation may access and operate second and third devices through a second interface device. On a multiple device system, the mix of a group of users each using one prototyping device and another group of users each using multiple prototyping devices is flexible. Furthermore, the combination can be changed dynamically.

It will be appreciated by those skilled in the art that changes, modifications, variations, and/or adjustments can be made to the disclosed embodiments described above without departing from the concepts or examples disclosed herein. Therefore, implementations are not limited to the particular embodiments disclosed, but may include changes, modifications, variations, and/or adjustments consistent with the disclosed embodiments.

What is claimed is:

1. A system for emulating a circuit design, the system comprising:
   a host workstation coupled by an emulation interface to a field programmable gate array (FPGA) configured to emulate and verify the circuit design when the host workstation is invoked to verify the circuit design, wherein the emulation interface is configured to provide timing and control information for at least the verify; and
   a non-transitory computer readable storage medium comprising instructions, which when executed cause the host workstation to:
      compile a portion of the circuit design and an associated verification module adapted to configure the FPGA, wherein a compilation is performed in accordance with a description file.

2. The system of claim 1, wherein the emulation interface is further configured to receive and process a plurality of probed signals.

3. The system of claim 2, wherein the emulation interface is further configured to receive and process a plurality of signal values associated with a subset of the plurality of probed signals.

4. The system of claim 3, wherein the emulation interface is further configured to store the plurality of signal values.

5. The system of claim 1, wherein the description file includes a description of a board including the FPGA.

6. The system of claim 1, wherein the emulation interface is further configured to communicate with the associated verification module.

7. The system of claim 1, wherein the verification module is configured to communicate with the portion of the circuit design in the FPGA using a plurality of probed signals.

8. The system of claim 1, wherein the emulation interface is further configured to run a plurality of emulation cycles.

9. The system of claim 8, wherein the compilation is configured such that the emulation cycles are controlled by a plurality of clocks generated by a software component running on the host workstation, when the host workstation is invoked to run the software component.

10. The system of claim 8, wherein the compilation is configured such that the emulation cycles are controlled by a plurality of clocks generated by a board including the FPGA.

11. The system of claim 10, wherein the compilation is further configured such that a subset of the plurality of clocks is suspended when a message from a software component running on the host workstation is received by the emulation interface.

12. The system of claim 1, wherein the emulation interface is further configured to transmit a plurality of input signals to the verification module.

13. The system of claim 12, wherein the compilation is configured such that a subset of the plurality of input signals control a state associated with the FPGA.

14. The system of claim 12, wherein the compilation is configured such that a plurality of probed signals are used to verify the portion of the circuit design in accordance with a subset of the plurality of input signals.

15. The system of claim 14, wherein the emulation interface is further configured such that a plurality of signal values associated with a subset of the plurality of probed signals is captured in accordance with a subset of the plurality of input signals.

16. The system of claim 1 further comprising:
   a plurality of FPGAs each configured to emulate and verify a different one of a plurality of portions of the circuit design; and
   a non-transitory computer readable storage medium comprising instructions, which when executed further cause the host workstation to:
      compile one of the plurality of portions of the circuit design and an associated different one of a plurality of verification modules adapted to configure a different one of the plurality of FPGAs.

17. The system of claim 16, wherein each of the plurality of FPGAs is on a board.

18. The system of claim 16, wherein each of the plurality of FPGAs is on a different one of a plurality of boards.

19. The system of claim 18 further comprising a plurality of emulation interfaces coupled to the host workstation, wherein each of the plurality of emulation interfaces is coupled to a different one of the plurality of boards.

20. The system of claim 1 further comprising a target component controlled by the emulated circuit design, wherein the target component is not in the host workstation, emulation interface, or a board including the FPGA.

21. A method for emulating a circuit design, the method comprising:
   emulating and verifying the circuit design using a host workstation coupled by an emulation interface to a field programmable gate array (FPGA) when the host workstation is invoked to verify the circuit design;
   providing timing and control information via the emulation interface for at least the verifying; and
   compiling a portion of the circuit design and an associated verification module to configure the FPGA, wherein the compiling is performed in accordance with a description file.

22. The method of claim 21, wherein the emulation interface receives and processes a plurality of probed signals.

23. The method of claim 22, wherein the emulation interface receives and processes a plurality of signal values associated with a subset of the plurality of probed signals.

24. The method of claim 23, wherein the emulation interface stores the plurality of signal values.

25. The method of claim 21, wherein the description file includes a description of a board including the FPGA.

26. The method of claim 21, wherein the emulation interface communicates with the associated verification module.

27. The method of claim 21, wherein the verification module communicates with the portion of the circuit design in the FPGA using a plurality of probed signals.

28. The method of claim 21, wherein the emulation interface runs a plurality of emulation cycles.

29. The method of claim 28, wherein the emulation cycles are controlled by a plurality of clocks generated by a software component running on the host workstation, when the host workstation is invoked to run the software component.

30. The method of claim 28, wherein the emulation cycles are controlled by a plurality of clocks generated by a board including the FPGA.

31. The method of claim 30, wherein a subset of the plurality of clocks is suspended when a message from a software component running on the host workstation is received by the emulation interface.

32. The method of claim 21, wherein the emulation interface transmits a plurality of input signals to the verification module.

33. The method of claim 32, wherein a subset of the plurality of input signals control a state associated with the FPGA.

34. The method of claim 32, wherein a plurality of probed signals are used to verify the portion of the circuit design in accordance with a subset of the plurality of input signals.

35. The method of claim 34, wherein a plurality of signal values associated with a subset of the plurality of probed signals is captured by the emulation interface in accordance with a subset of the plurality of input signals.

36. The method of claim 21 further comprising:
emulating and verifying one of a plurality of portions of the circuit design using a different one of a plurality of FPGAs; and
compiling, using the host workstation, one of the plurality of portions of the circuit design and an associated different one of a plurality of verification modules to configure a different one of the plurality of FPGAs.

37. The method of claim 36, wherein each of the plurality of FPGAs is on a board.

38. The method of claim 36, wherein each of the plurality of FPGAs is on a different one of a plurality of boards.

39. The method of claim 38 further comprising coupling a plurality of emulation interfaces to the host workstation, wherein each of the plurality of emulation interfaces is coupled to a different one of the plurality of boards.

40. The method of claim 21 further comprising controlling a target component by the emulated circuit design, wherein the target component is not in the host workstation, emulation interface, or a board including the FPGA.

* * * * *